US011785792B2

(12) United States Patent
Jeon et al.

(10) Patent No.: US 11,785,792 B2
(45) Date of Patent: Oct. 10, 2023

(54) DISPLAY APPARATUS HAVING TRANSMISSION AREA AND METHOD OF MANUFACTURING THE SAME

(71) Applicant: SAMSUNG DISPLAY CO., LTD., Yongin-si (KR)

(72) Inventors: Joohee Jeon, Yongin-si (KR); Sangha Park, Yongin-si (KR); Dahee Jeong, Yongin-si (KR); Kyuhwan Hwang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 156 days.

(21) Appl. No.: 17/179,184

(22) Filed: Feb. 18, 2021

(65) Prior Publication Data

US 2021/0313539 A1 Oct. 7, 2021

(30) Foreign Application Priority Data

Apr. 2, 2020 (KR) .......................... 10-2020-0040480

(51) Int. Cl.
*H10K 50/822* (2023.01)
*H10K 59/122* (2023.01)
*H10K 59/124* (2023.01)
*H10K 59/131* (2023.01)
*H10K 59/35* (2023.01)
(Continued)

(52) U.S. Cl.
CPC ......... *H10K 50/822* (2023.02); *H10K 59/122* (2023.02); *H10K 59/124* (2023.02); *H10K 59/131* (2023.02); *H10K 59/353* (2023.02); *H10K 71/00* (2023.02); *H10K 59/1201* (2023.02)

(58) Field of Classification Search
CPC . H01L 51/5225; H01L 51/56; H01L 27/3218; H01L 27/3246; H01L 27/3258; H01L 27/3276; H01L 2227/323; H10K 59/353; H10K 59/131; H10K 59/122; H10K 59/124; H10K 59/1201; H10K 71/00; H10K 50/822
USPC ..................................................... 257/40, 59
See application file for complete search history.

(56) References Cited

U.S. PATENT DOCUMENTS 9,128,338 B2   9/2015  Yim et al.
9,911,941 B2   3/2018  Choi et al.
(Continued)

FOREIGN PATENT DOCUMENTS

KR   10-2017-0002719   1/2017
KR   10-2017-0113066   10/2017
(Continued)

*Primary Examiner* — Lex H Malsawma
*Assistant Examiner* — Eric W Jones
(74) *Attorney, Agent, or Firm* — F. CHAU & ASSOCIATE, LLC

(57) ABSTRACT

A display apparatus includes a substrate including a first display area and a second display area. The second display area includes a transmission area, a plurality of first opposite electrodes and a plurality of second opposite electrodes each corresponding to the first display area, and a plurality of third opposite electrodes and a plurality of fourth opposite electrodes each corresponding to the second display area and surrounding at least a portion of the transmission area. A shape of each of the plurality of first opposite electrodes is the same as that of each of the plurality of third opposite electrodes.

19 Claims, 25 Drawing Sheets

(51) Int. Cl.
    *H10K 71/00*      (2023.01)
    *H10K 59/12*      (2023.01)

(56)            References Cited

U.S. PATENT DOCUMENTS

2006/0060850 A1*  3/2006  Kwak ................. H01L 27/3276
                                                        257/E27.111
2014/0242737 A1*  8/2014  Chung ............... H01L 51/5221
                                                        118/504
2015/0364715 A1* 12/2015  Yoon .................... H01L 51/5234
                                                        257/40
2017/0256747 A1*  9/2017  Lee ..................... H01L 27/3218
2019/0130822 A1   5/2019  Jung

FOREIGN PATENT DOCUMENTS

KR          10-1885698       8/2018
KR       10-2016-0130042     11/2018

* cited by examiner

DISPLAY APPARATUS HAVING TRANSMISSION AREA AND METHOD OF MANUFACTURING THE SAME

CROSS-REFERENCE TO RELATED APPLICATION

This application claims the benefit of and priority under 35 U.S.C. § 119 to Korean Patent Application No. 10-2020-0040480, filed on Apr. 2, 2020, in the Korean Intellectual Property Office, the disclosure of which is incorporated by reference herein in its entirety.

TECHNICAL FIELD

The present disclosure relates to a display apparatus and, more specifically, to a display apparatus having a transmission area and a method of manufacturing the same.

DISCUSSION OF RELATED ART

Today, display apparatuses are more widely used than ever. In addition, display apparatuses have become thinner and lighter, allowing for their use in all manner of devices.

As the display apparatuses are variously utilized, there may be various methods in designing the shape of the display apparatuses that may allow for efficient production of diversely shaped displays. In addition, a variety of different functional devices are being integrated into display apparatuses thereby making modern display apparatuses more capable than ever.

SUMMARY

A display apparatus includes a substrate including a first display area and a second display area. The second display area includes a transmission area. A plurality of first opposite electrodes and a plurality of second opposite electrodes each correspond to the first display area. A plurality of third opposite electrodes and a plurality of fourth opposite electrodes each correspond to the second display area and surround at least a portion of the transmission area. A shape of the plurality of first opposite electrodes is the same as that of the plurality of third opposite electrodes.

A shape of the plurality of second opposite electrodes may be the same as that of the plurality of fourth opposite electrodes.

An area of each of the plurality of third opposite electrodes may be different from an area of each of the plurality of fourth opposite electrodes.

Each of the plurality of first opposite electrodes and the plurality of fourth opposite electrodes may correspond to two pixels.

Each of the plurality of first opposite electrodes may have a first quadrangular shape having a long side in a first direction, and first opposite electrodes neighboring each other in the first direction among the plurality of first opposite electrodes may overlap each other at an edge of the first quadrangle.

The plurality of first opposite electrodes may be spaced apart from each other in a second direction intersecting with the first direction, and some of the plurality of second opposite electrodes may be arranged within the space between the plurality of first opposite electrodes.

Each of the plurality of third opposite electrodes may have a third quadrangular shape having a long side in a first direction, and the transmission area may be arranged between third opposite electrodes neighboring each other in the first direction among the plurality of third opposite electrodes.

The plurality of first opposite electrodes may at least partially overlap the plurality of third opposite electrodes at a boundary between the first display area and the second display area.

The plurality of second opposite electrodes may at least partially overlap the plurality of fourth opposite electrodes at a boundary between the first display area and the second display area.

The display apparatus may further include a region in which two first opposite electrodes among the plurality of first opposite electrodes may overlap one second opposite electrode among the plurality of second opposite electrodes.

A method of manufacturing a display apparatus including a first display area and a second display area, the second display area including a transmission area, includes aligning a first mask corresponding to a substrate. A portion of an opposite electrode is deposited first on the substrate by using the first mask. A portion of the opposite electrode is deposited second by moving the first mask in a +x direction and a +y direction intersecting with the +x direction. A second mask is aligned to correspond to the substrate. A portion of the opposite electrode is deposited third on the substrate by using the second mask. A remainder of the opposite electrode is deposited fourth by moving the second mask in a (−) x direction and the +y direction.

The first mask may include first mask openings and third mask openings. The first mask openings may have the same shape and the same size as the third mask openings. A separation distance of the first mask openings may be different from a separation distance of the third mask openings.

The second mask may include second mask openings and fourth mask openings. The second mask openings may have the same shape and the same size as the fourth mask openings. A separation distance of the second mask openings may be different from a separation distance of the fourth mask openings. A size of the second mask openings may be different from a size of the first mask openings.

The first mask openings and the second mask openings may have a rectangular shape having a long side in −45° direction with respect to the x direction.

A display apparatus includes a substrate including a first display area, a second display area, and a non-display area. The second display area includes a transmission area. The non-display area is outside of the first display area and the second display area. Opposite electrodes correspond to the first display area and the second display area. A power supply line is arranged in the non-display area. Some of the opposite electrodes overlap the power supply line, and some of outer patterns of the opposite electrodes arranged in an outermost portion are spaced apart from each other.

The opposite electrodes may include a plurality of first opposite electrodes arranged in the first display area and a plurality of third opposite electrodes arranged in the second display area. The plurality of first opposite electrodes may have the same shape and the same size as the plurality of third opposite electrodes.

The display apparatus may further include a planarization layer arranged on the power supply line and including a contact hole that exposes a portion of the power supply line. A connection line may be arranged on the planarization layer connected to the power supply line through the contact hole. Some of the opposite electrodes may contact the connection line.

The separation space might not be arranged between the outer patterns arranged outside the first display area.

A display apparatus includes a substrate including a first display area and a second display area. The second display area includes a transmission area. A plurality of first opposite electrodes and a plurality of second opposite electrodes each correspond to the first display area. A plurality of third opposite electrodes and a plurality of fourth opposite electrodes each correspond to the second display area and surround at least a portion of the transmission area. A shape of the plurality of first opposite electrodes is the same as that of the plurality of second opposite electrodes. A shape of the plurality of third opposite electrodes is different from that of the plurality of fourth opposite electrodes.

An edge of the plurality of first opposite electrodes may be provided in a rounded rhombus shape (e.g. a rhombus shape with rounded corners), and an edge of the plurality of third opposite electrodes may be provided in a rounded rectangular shape (e.g. a rectangular shape with rounded corners).

A size of the plurality of third opposite electrodes may be greater than a size of the plurality of fourth opposite electrodes.

Each of the plurality of third opposite electrodes may correspond to six pixels, and each of the plurality of fourth opposite electrodes may correspond to two pixels.

Each of the plurality of first opposite electrodes may correspond to four pixels.

A display device includes a first display area including first pixels of a first pixel density and a second display area including second pixels of a second pixel density that is less than the first pixel density. A sensor is disposed within a transmission area of the second display area. Electrodes of the second pixels at least partially surround the transmission area.

A shape and size of the electrodes of the second pixels may be the same as that of electrodes of the first pixel. The sensor may be configured to emit or receive light or sound.

BRIEF DESCRIPTION OF THE DRAWINGS

The above and other aspects, features, and elements of certain embodiments of the disclosure will be more apparent from the following description taken in conjunction with the accompanying drawings, in which.

DETAILED DESCRIPTION OF THE DRAWINGS

Figure 1:
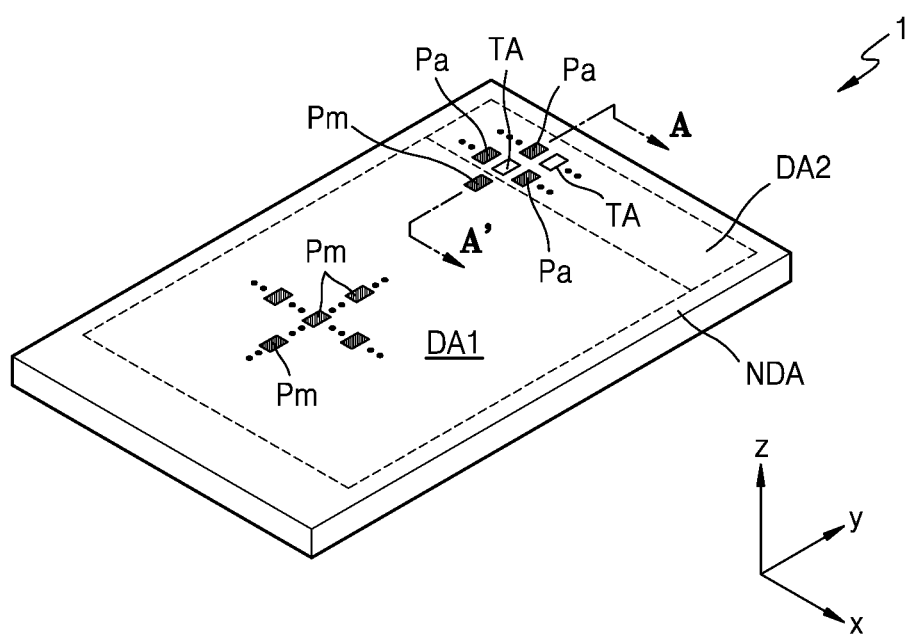
FIG. 1 is a perspective view illustrating a display apparatus according to an exemplary embodiment of the present disclosure.

Reference will now be made in detail to exemplary embodiments of the present disclosure, examples of which are illustrated in the accompanying drawing. Like reference numerals may refer to like elements throughout the drawings and the specification. In this regard, the present invention may have different forms and should not necessarily be construed as being limited to the descriptions set forth herein. Accordingly, several exemplary embodiments of the present disclosure are described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, exemplary embodiments will be illustrated in the drawings and described in detail in the written description. Effects and characteristics of the present disclosure, and a method of accomplishing the same will become apparent and more readily appreciated from the following description of the embodiments and the accompanying drawings. However, the present invention is not necessarily limited to the exemplary embodiments presented below and the invention may be implemented in various other forms.

Hereinafter, embodiments are described in detail with reference to the accompany drawings. When description is made with reference to the drawings, like reference numerals may be given to like or corresponding elements and to the extent that repeated descriptions thereof are omitted, it may be assumed that the elements for which no description is given are at least similar to corresponding elements described elsewhere in the specification.

It will be understood that although the terms "first," "second," etc. may be used herein to describe various components, these components should not necessarily be limited by these terms. These components might only be used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. In contrast, the term "consisting of" is intended to preclude the presence or addition of one or more other features or components.

It will be understood that when a layer, region, or component is referred to as being "formed on," another layer, region, or component, it can be directly or indirectly formed on the other layer, region, or component. For example, for example, intervening layers, regions, or components may be present.

Sizes of elements in the drawings may be exaggerated or reduced for convenience of explanation. In other words, since sizes and thicknesses of components in the drawings may be illustrated for convenience of explanation, the following embodiments are not necessarily limited thereto.

When a certain embodiment may be implemented differently, a specific process order may be performed differently from the described order. For example, two consecutively described processes may be performed substantially at the same time or performed in an order opposite to, or otherwise different from, the described order.

It will be understood that when a layer, region, or component is referred to as being "connected" to another layer, region, or component, it may be "directly connected" to the other layer, region, or component and/or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component and/or may be "indirectly electrically connected" to other layer, region, or component with other layer, region, or component interposed therebetween.

Referring to FIG. 1, the display apparatus 1 includes a first display area DA1, a second display area DA2, and a non-display area NDA. The first display area DA1 and the second display area DA2 display an image, and the non-display area NDA does not display an image. The display apparatus 1 may display a main image by using light emitted from a plurality of main pixels Pm arranged in the first display area DA1.

The display apparatus 1 includes the second display area DA2. The second display area DA2 may include a region in which a component is arranged therebelow, the component including a sensor or a camera (or an image sensor) that uses infrared light, visible light, and/or sound. The second display area DA2 may include a transmission area TA through which light and/or sound output from the component to the outside or progressing toward the component from the outside may pass. In an exemplary embodiment of the present disclosure, in the case where infrared light or visible light passes through the second display area DA2, a light transmittance of the second display area DA2 may be 30% or more, 50% or more, 75% or more, 80% or more, 85% or more, or 90% or more.

A plurality of auxiliary pixels Pa may be arranged in the second display area DA2, the display apparatus 1 may display a predetermined image by using light emitted from the plurality of auxiliary pixels Pa. An image displayed on the second display area DA2 is an auxiliary image and may have a lower resolution (e.g. number of pixels per unit area) than that of an image displayed on the first display area DA1. For example, because the second display area DA2 includes the transmission area TA through which light and/or sound may pass, the number of auxiliary pixels Pa arranged per unit area of the second display area DA2 may be less than the number of main pixels Pm arranged per unit area of the first display area DAL. Alternatively, the area of an auxiliary pixel Pa per unit area may be less than the area of a main pixel Pm per unit area.

The second display area DA2 may be arranged on one side of the first display area DA1. In an exemplary embodiment of the present disclosure, it is shown in FIG. 1 that the second display area DA2 is arranged on a top side of the first display area DA1 and thus it may be arranged between the non-display area NDA and the first display area DA1.

Hereinafter, though an organic light-emitting display apparatus is described as the display apparatus 1 as an example, the display apparatus of the present invention is not necessarily limited thereto. For example, various display apparatuses such as inorganic light-emitting display apparatuses and quantum-dot light-emitting display apparatuses may be used.

Though it is shown in FIG. 1 that the second display area DA2 is arranged on a top side of the first display area DA1, the present invention is not necessarily limited thereto. The shape of the first display area DA1 may include a circle, an ellipse, or polygons such as triangles or pentagons. The position of the second display area DA2 and the number of second display areas DA2 may be variously changed.

Figure 2:
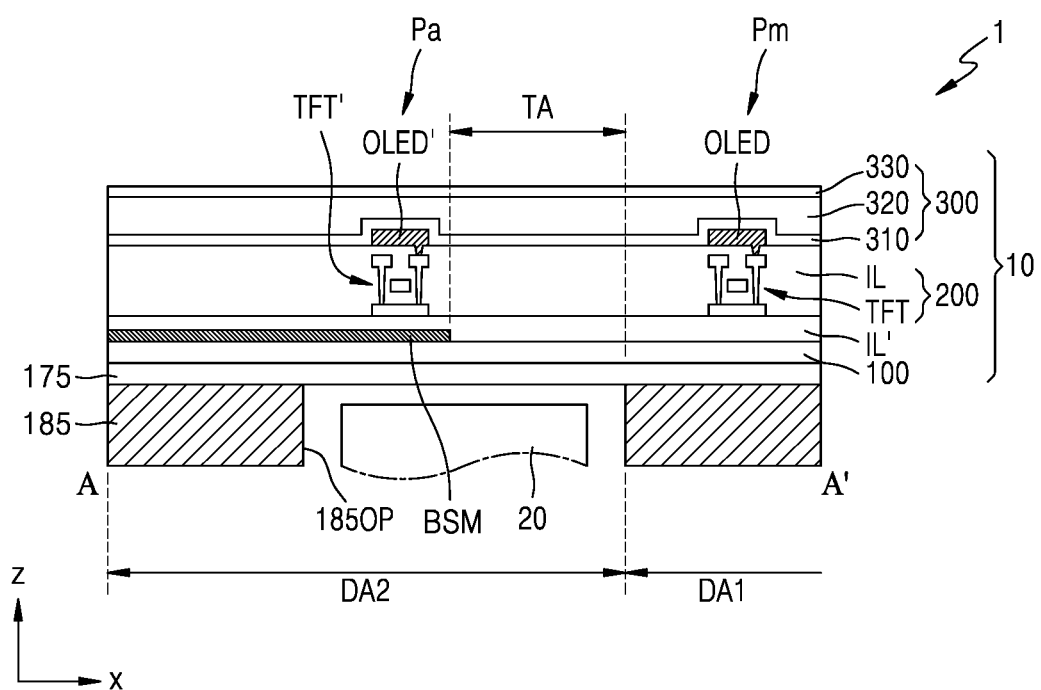
FIG. 2 is across-sectional view illustrating a display apparatus according to an exemplary embodiment of the present disclosure.

FIG. 2 is a cross-sectional view of the display apparatus 1 according to an exemplary embodiment of the present disclosure taken along line A-A' of FIG. 1.

Referring to FIG. 2, the display apparatus 1 may include a display panel 10 and a component 20. The display panel 10 includes a display element, and the component 20 corresponding to the second display area DA2.

The display panel 10 may include a substrate 100, a display element layer 200, and a thin-film encapsulation layer 300. The display element layer 200 may be arranged over the substrate 100. The thin-film encapsulation layer 300 may serve as a sealing member sealing the display element layer 200. In addition, the display panel 10 may further include a bottom protective film 175 and a bottom cover layer 185, each arranged under the substrate 100.

The substrate 100 may include glass or a polymer resin. The polymer resin may include polyethersulfone, polyacrylate, polyetherimide, polyethylene naphthalate (PEN), polyethylene terephthalate (PET), polyphenylene sulfide, polyarylate, polyimide (PI), polycarbonate, and/or cellulose acetate propionate (CAP). The substrate 100 including the polymer resin may be flexible, rollable, or bendable. For example, the substrate 100 including the polymer resin may be flexed, rolled, or bent, to a non-trivial degree, without cracking or otherwise breaking. The substrate 100 may have a multi-layered structure including a layer including the polymer resin and an inorganic layer.

The display element layer 200 may include a circuit layer, organic light-emitting diodes OLED and OLED', and insulating layers IL and IL' therebetween. The circuit layer may include thin film transistors TFT and TFT'.

A main pixel Pm may be arranged in the first display area DA1, and an auxiliary pixel Pa may be arranged in the second display area DA2. The main pixel Pm includes a main thin film transistor TFT and an organic light-emitting diode OLED connected thereto, and the auxiliary pixel Pa includes an auxiliary thin film transistor TFT' and an organic light-emitting diode OLED' connected thereto.

In addition, the transmission area TA may be arranged in the second display area DA2. The auxiliary thin film transistor TFT' and a display element need not be arranged in the transmission area TA. The transmission area TA may be a region through which light/signal emitted from the component 20 or light/signal incident to the component 20 passes (e.g. a majority of the light/signal not being absorbed or reflected).

The component 20 may be arranged in the second display area DA2. The component 20 may include an electronic element that uses light or sound. For example, the component 20 may include a sensor such as an infrared sensor that emits and/or receives light, a sensor that outputs and senses light or sound to measure a distance or recognize a fingerprint, a small lamp that outputs light, a speaker that outputs sound, and image sensor that captures an image. In the case of an electronic element that uses light, light in various wavelength bands such as visible light, infrared light, and ultraviolet light may be used. The component 20 arranged in the second display area DA2 may be provided in plural. For example, a light-emitter and a light-receiver as the component 20 may be provided together in one display area DA2. Alternatively, a light-emitter and a light-receiver may be simultaneously provided in one component 20.

A bottom metal layer BSM may be arranged in the second display area DA2. The bottom metal layer BSM may correspond to the auxiliary thin film transistor TFT'. The bottom metal layer BSM may correspond to the second display area DA2 excluding the transmission area TA. The bottom metal layer BSM may block external light reaching the auxiliary pixel Pa including the auxiliary thin film transistor TFT', etc. Alternatively, the bottom metal layer BSM may prevent light emitted from the component 20 from being diffracted by a slit formed by wirings arranged in the second display area DA2.

In an exemplary embodiment of the present disclosure, because a constant voltage or signal may be applied to the bottom metal layer BSM, damage to the pixel circuit due to electrostatic discharge may be prevented.

The thin-film encapsulation layer 300 may include at least one inorganic encapsulation layer and at least one organic encapsulation layer. With regard to this, FIG. 2 shows first and second inorganic encapsulation layers 310 and 330 and an organic encapsulation layer 320 disposed therebetween.

The first and second inorganic encapsulation layers 310 and 330 may include at least one inorganic insulating material among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, and/or polyethylene.

The bottom protective film 175 may be attached to a bottom portion of the substrate 100 to support and protect the substrate 100. The bottom protective film 175 may include a material having a high transmittance with respect to light. For example, the bottom protective film 175 may include PET and/or PI.

The bottom cover layer 185 may be arranged under the bottom protective film 175. The bottom cover layer 185 may include an opening 185OP corresponding to the second display area DA2. Because the bottom cover layer 185 includes the opening 185OP, a light transmittance of the second display area DA2 may be increased. The bottom cover layer 185 may include a light-blocking material. Accordingly, the bottom cover layer 185 may block external light that may pass through a bottom surface of the substrate 100.

The area of the second display area DA2 may be greater than an area in which the component 20 is arranged. Therefore, the area of the opening 185OP of the bottom cover layer 185 might not coincide with the area of the second display area DA2. For example, the area of the opening 185OP may be less than the area of the second display area DA2.

In addition, a plurality of components 20 may be arranged in the second display area DA2. The plurality of components 20 may have different functions.

Elements such as an input sensing member, a reflection prevention member, and a transparent window may be further arranged on the display panel 10. The input sensing member may be configured to sense a touch input. The reflection prevention member may include a polarizer, a retarder, color filters, and/or a black matrix.

Though the thin-film encapsulation layer 300 may be used as an encapsulation member sealing the display element layer 200, the present invention is not necessarily limited thereto. For example, as a member sealing the display element layer 200, a sealing substrate that is attached to the substrate 100 by using sealant or frit may be used.

Figure 3:
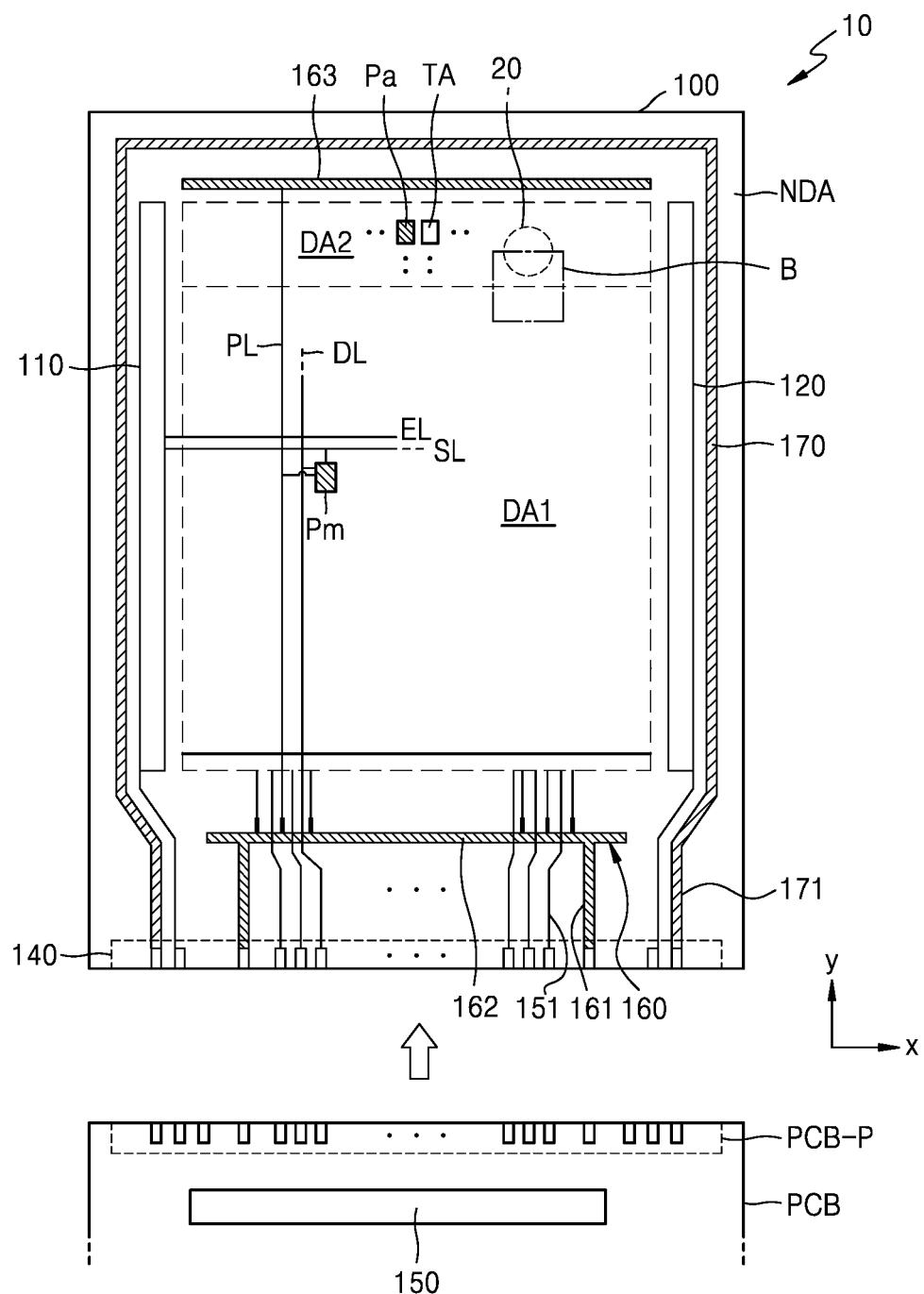
FIG. 3 is a plan view illustrating a display apparatus according to an exemplary embodiment of the present disclosure.

FIG. 3 is a plan view of the display panel 10 according to an exemplary embodiment of the present disclosure.

Referring to FIG. 3, the display panel 10 is arranged in the first display area DA1 and includes a plurality of main pixels Pm. Each of the main pixels Pm may include a display element such as an organic light-emitting diode. Each main pixel Pm may emit, for example, red, green, blue, or white light through an organic light-emitting diode. In the present specification, as described above, the main pixel Pm may be understood to be a sub-pixel emitting red, green, blue, or white light. The first display area DA1 is covered by the encapsulation member described above with reference to FIG. 2 and thus may be protected from external air or moisture.

The second display area DA2 may be arranged on one side of the first display area DA1. A plurality of auxiliary pixels Pa may be arranged in the second display area DA2. Each of the auxiliary pixels Pa may include a display element such as an organic light-emitting diode. Each auxiliary pixel Pa may emit, for example, red, green, blue, or white light through an organic light-emitting diode. In the present specification, as described above, the auxiliary pixel Pa may be understood to be a sub-pixel emitting red, green, blue, or white light. The transmission area TA may be provided in the second display area DA2, the transmission area TA being arranged between the auxiliary pixels Pa. At least one component 20 may be arranged below the second display area DA2 of the display panel 10.

In an exemplary embodiment of the present disclosure, a pixel circuit of one main pixel Pm may be the same as that of one auxiliary pixel Pa. However, the present invention is not necessarily limited thereto. A pixel circuit of the main pixel Pm may be different from a pixel circuit of the auxiliary pixel Pa.

Because the second display area DA2 includes the transmission area TA, the resolution of the second display area DA2 may be less than that of the first display area DA1. For example, the resolution of the second display area DA2 may be about ½ of the resolution of the first display area DA1, per unit area. In an exemplary embodiment of the present disclosure, the resolution of the first display area DA1 may be 400 ppi (pixels per inch) or more, and the resolution of the second display area DA2 may be 200 ppi or more. A region B of FIG. 3 represents a portion of a boundary between the first display area DA1 and the second display area DA2, which is described below in detail.

The pixels, for example, the main pixel Pm and the auxiliary pixel Pa, may be electrically connected to outer circuits arranged in the non-display area NDA. A first scan driving circuit 110, a second scan driving circuit 120, a terminal 140, a data driving circuit 150, a first power supply line 160, and a second power supply line 170 may be arranged in the non-display area NDA.

The first scan driving circuit 110 may provide a scan signal to the pixels, for example, the main pixel Pm and the auxiliary pixel Pa, through a scan line SL. The first scan driving circuit 110 may provide an emission control signal to each pixel through an emission control line EL. The second scan driving circuit 120 may be arranged in parallel to the first scan driving circuit 110 with the first display area DA1 disposed therebetween. Some of the pixels, for example, the main pixels Pm and the auxiliary pixels Pa, may be electrically connected to the first scan driving circuit 110, and the rest of the pixels, for example, the main pixels Pm and the auxiliary pixels Pa, may be electrically connected to the second scan driving circuit 120. In an exemplary embodiment of the present disclosure, the second scan driving circuit 120 may be omitted.

The terminal 140 may be arranged on one side of the substrate 100. The terminal 140 may be exposed and electrically connected to a printed circuit board PCB by not being covered by an insulating layer. A terminal PCB-P of the printed circuit board PCB may be electrically connected to the terminal 140 of the display panel 10. The printed circuit board PCB transfers a signal or power of a controller to the display panel 10. A control signal generated by the controller may be transferred to the first and second scan driving circuits 110 and 120 through the printed circuit board PCB. The controller may respectively provide first and second power voltages ELVDD and ELVSS (see FIGS. 4A and 4B and the corresponding explanation below) to the first and second power supply lines 160 and 170 through first and second connection lines 161 and 171. The first power voltage ELVDD (also referred to as a driving voltage) may be provided to the pixels, for example, the main pixel Pm and the auxiliary pixel Pa through a driving voltage line PL connected to the first power supply line 160, and the second power voltage ELVSS (also referred to as a common voltage) may be provided to an opposite electrode of the pixels, for example, the main pixel Pm and the auxiliary pixel Pa connected to the second power supply line 170.

The data driving circuit 150 is electrically connected to the data line DL. A data signal of the data driving circuit 150 may be provided to the pixels, for example, the main pixel Pm and the auxiliary pixel Pa through a connection line 151 and the data line DL, the connection line 151 being connected to the terminal 140, and the data line DL being connected to the connection line 151. Though it is shown in FIG. 3 that the data driving circuit 150 is arranged on the printed circuit board PCB, the data driving circuit 150 may alternatively be arranged on the substrate 100. For example, the data driving circuit 150 may be arranged between the terminal 140 and the first power supply line 160.

The first power supply line 160 may include a first sub-line 162 and a second sub-line 163, the first sub-line 162 and the second sub-line 163 extending in an x direction in parallel to each other with the first display area DA1 disposed therebetween. The second power supply line 170 may have a loop shape with one open side and may partially surround the first display area DA1.

Figure 4A:
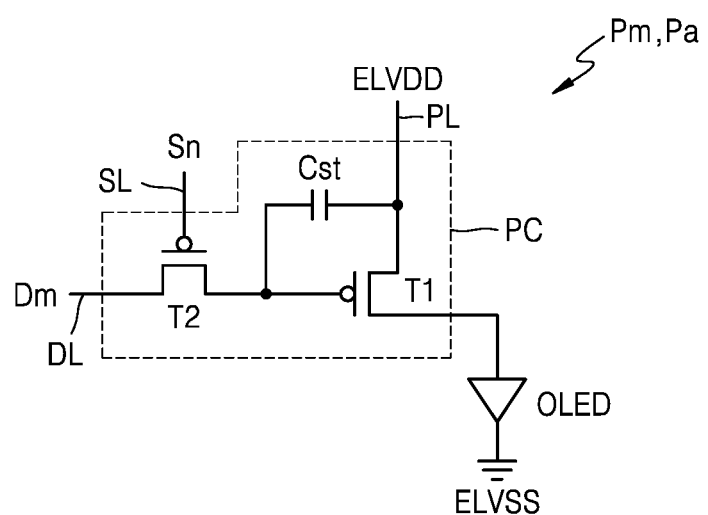
FIG. 4A is an equivalent circuit diagram illustrating an active-matrix driven pixel arranged in a display area of a display apparatus according to an exemplary embodiment of the present disclosure.
Figure 4B:
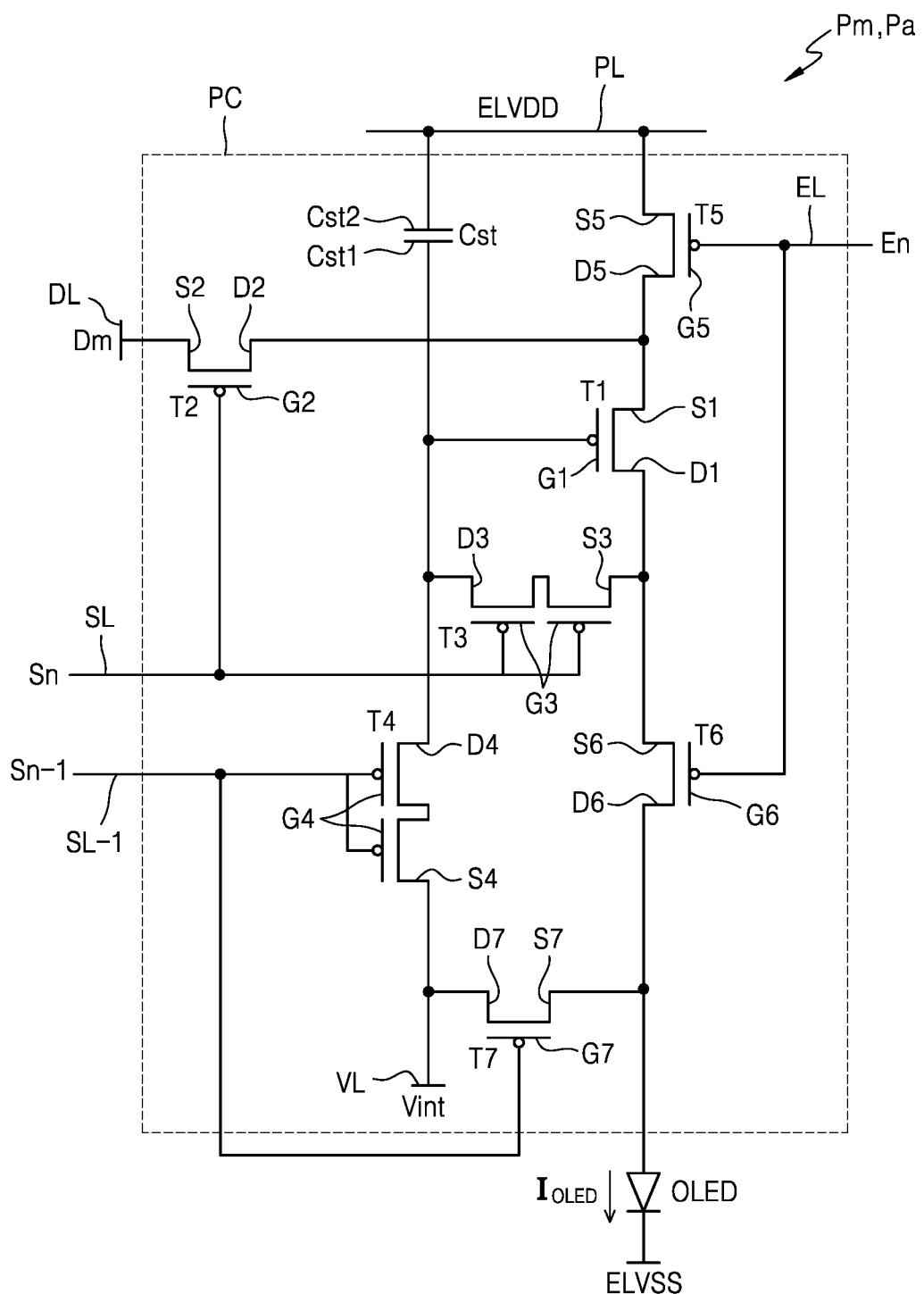
FIG. 4B is an equivalent circuit diagram illustrating an active-matrix driven pixel arranged in a display area of a display apparatus according to an exemplary embodiment of the present disclosure.

FIGS. 4A and 4B are equivalent circuit diagrams of a main pixel and/or an auxiliary pixel which may be included in the display panel 10 according to an exemplary embodiment of the present disclosure.

Referring to FIG. 4A, each of the pixels, for example, the main pixel Pin and the auxiliary pixel Pa includes a pixel circuit PC and an organic light-emitting diode OLED, the pixel circuit PC being connected to the scan line SL and the data line DL, and the organic light-emitting diode OLED being connected to the pixel circuit PC.

The pixel circuit PC includes a driving thin film transistor T1, a switching thin film transistor T2, and a storage capacitor Cst. The switching thin film transistor T2 may be connected to the scan line SL and the data line DL and may transfer a data signal Dm input from the data line DL to the driving thin film transistor T1 based on a scan signal Sn input from the scan line SL.

The storage capacitor Cst may be connected to the switching thin film transistor T2 and the driving voltage line PL and may store a voltage corresponding to a difference between a voltage transferred from the switching thin film transistor T2 and the first power voltage ELVDD supplied to the driving voltage line PL.

The driving thin film transistor T1 may be connected between the driving voltage line PL and the storage capacitor Cst and may control a driving current flowing through the organic light-emitting diode OLED from the driving voltage line PL in response to the voltage stored in the storage capacitor Cst. The organic light-emitting diode OLED may emit light having a predetermined brightness according to the driving current.

Though FIG. 4A describes the case where the pixel circuit PC includes two thin film transistors and one storage capacitor, the present invention is not necessarily limited thereto. As shown in FIG. 4B, the pixel circuit PC may include seven thin film transistors and one storage capacitor.

Referring to FIG. 48, each of the pixels, for example, the main pixel Pm and the auxiliary pixel Pa includes a pixel circuit PC and an organic light-emitting diode OLED, the organic light-emitting diode OLED being connected to the pixel circuit PC. The pixel circuit PC may include a plurality of thin film transistors and a storage capacitor. The thin film transistors and the storage capacitor may be connected to signal lines SL, SL−1, EL, and DL, an initialization voltage line VL, and a driving voltage line PL.

Though it is shown in FIG. 4B that each of the pixels, for example, the main pixel Pm and the auxiliary pixel Pa is connected to the signal lines SL, SL−1, EL, and DL, the initialization voltage line VL, and the driving voltage line PL, the present invention is not necessarily limited thereto. In an exemplary embodiment of the present disclosure, at least one of the signal lines SL, SL−1, EL, and DL, the initialization voltage line VL, and the driving voltage line PL may be shared by neighboring pixels.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The signal lines SL, SL−1, SL+1, EL, and DL may include the scan line SL, the previous scan line SL−1, the emission control line EL, and the data line DL, the scan line SL transferring a scan signal Sn, the previous scan line SL−1 transferring a previous scan signal Sn-1 to the first initialization thin film transistor T4 and the second initialization thin film transistor T7, the emission control line EL transferring an emission control signal En to the operation control thin film transistor T5 and the emission control thin film transistor T6, and the data line DL intersecting with the scan line SL and transferring a data signal Dm. The driving voltage line PL transfers the driving voltage ELVDD to the driving thin film transistor T1, and the initialization voltage line VL transfers the initialization voltage Vint initializing the driving thin film transistor T1 and the pixel electrode.

A driving gate electrode G1 of the driving thin film transistor T1 is connected to a first storage capacitor plate Cst1 of the storage capacitor Cst, a driving source electrode S1 of the driving thin film transistor T1 is connected to the driving voltage line PL through the operation control thin film transistor T5, and a driving drain electrode D1 of the driving thin film transistor T1 is electrically connected to a pixel electrode of a main organic light-emitting diode OLED through the emission control thin film transistor T6. The driving thin film transistor T1 receives a data signal Dm depending on a switching operation of the switching thin film transistor T2 and supplies a driving current $I_{OLED}$ to the main organic light-emitting diode OLED.

A switching gate electrode G2 of the switching thin film transistor T2 is connected to the scan line SL, a switching source electrode S2 of the switching thin film transistor T2 is connected to the data line DL, and a switching drain electrode D2 of the switching thin film transistor T2 is connected to the driving source electrode S1 of the driving thin film transistor T1 and simultaneously connected to the driving voltage line PL through the operation control thin film transistor T5. The switching thin film transistor T2 is turned on in response to a scan signal Sn transferred through the scan line SL and performs a switching operation of transferring a data signal Dm transferred through the data line DL to the driving source electrode S1 of the driving thin film transistor T1.

A compensation gate electrode G3 of the compensation thin film transistor T3 is connected to the scan line SL, a compensation source electrode S3 of the compensation thin film transistor T3 is connected to the driving drain electrode D1 of the driving thin film transistor T1 and simultaneously connected to the pixel electrode of the main organic light-emitting diode OLED through the emission control thin film transistor T6, and a compensation drain electrode D3 of the compensation thin film transistor T3 is connected to the first storage capacitor plate Cst1 of the storage capacitor Cst, a first initialization drain electrode D4 of the first initialization thin film transistor T4, and the driving gate electrode G1 of the driving thin film transistor T1. The compensation thin film transistor T3 is turned-on in response to a scan signal Sn transferred through the scan line SL and diode-connects the driving thin film transistor T1 by electrically connecting the driving gate electrode G1 to the driving drain electrode D1 of the driving thin film transistor T1.

A first initialization gate electrode G4 of the first initialization thin film transistor T4 is connected to the previous scan line SL−1, a first initialization source electrode S4 of the first initialization thin film transistor T4 is connected to a second initialization drain electrode D7 of the second initialization thin film transistor T7 and the initialization voltage line VL, and a first initialization drain electrode D4 of the first initialization thin film transistor T4 is connected to the first storage capacitor plate Cst1 of the storage capacitor Cst, the compensation drain electrode D3 of the compensation thin film transistor T3, and the driving gate electrode G1 of the driving thin film transistor T1. The first initialization thin film transistor T4 is turned on in response to a previous scan signal Sn-1 transferred through the previous scan line SL−1 and performs an initialization operation of initializing a voltage of the gate electrode G1 of the driving thin film transistor T1 by transferring the initialization voltage Vint to the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the driving voltage line PL, and an operation control drain electrode D5 of the operation control thin film transistor T5 is connected to the driving source electrode S1 of the driving thin film transistor T1, and the switching drain electrode D2 of the switching thin film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and the compensation source electrode S3 of the compensation thin film transistor T3, and an emission control drain electrode D6 of the emission control thin film transistor T6 is electrically connected to the second initialization source electrode S7 of the second initialization thin film transistor T7 and the pixel electrode of the organic light-emitting diode OLED.

The operation control thin film transistor T5 and the emission control thin film transistor T6 are simultaneously turned on in response to an emission control signal En transferred through the emission control line EL, the driving voltage ELVDD is transferred to the main organic light-emitting diode OLED, and the driving current $I_{OLED}$ flows through the main organic light-emitting diode OLED.

A second initialization gate electrode G7 of the second initialization thin film transistor T7 is connected to the previous scan line SL−1, a second initialization source electrode S7 of the second initialization thin film transistor T7 is connected to the emission control drain electrode D6 of the emission control thin film transistor T6 and the pixel electrode of the main organic light-emitting diode OLED, and a second initialization drain electrode D7 of the second initialization thin film transistor T7 is connected to the first initialization source electrode S4 of the first initialization thin film transistor T4 and the initialization voltage line VL. The second initialization thin film transistor T7 is turned on in response to a previous scan signal Sn-1 transferred through the previous scan line SL−1 to initialize the pixel electrode of the main organic light-emitting diode OLED.

Though it is shown in FIG. 4B that the first initialization thin film transistor T4 and the second initialization thin film transistor T7 are connected to the previous scan line SL−1, the present invention is not necessarily limited thereto. For example, the first initialization thin film transistor T4 may be connected to the previous scan line SL−1 and driven according to a previous scan signal Sn-1, and the second initialization thin film transistor T7 may be connected to a separate signal line (e.g. a next scan line) and driven according to a signal transferred through the separate signal line.

A second storage capacitor plate Cst2 of the storage capacitor Cst is connected to the driving voltage line PL, and an opposite electrode of the organic light-emitting diode OLED is connected to the second power supply line 170 through which the common voltage ELVSS is transferred. Therefore, the organic light-emitting diode OLED may display an image by receiving the driving current Ioin from the driving thin film transistor T1 and emitting light.

Though it is shown in FIG. 4B that the compensation thin film transistor T3 and the first initialization thin film transistor T4 each include a dual gate electrode, the compensation thin film transistor T3 and the first initialization thin film transistor T4 may include one gate electrode.

A pixel circuit PC of the main pixel Pm may be the same as that of the auxiliary pixel Pa. However, the present invention is not necessarily limited thereto. A pixel circuit PC of the main pixel Pm may be different from that of the auxiliary pixel Pa. For example, the main pixel Pm may employ a pixel circuit of FIG. 4B, and the auxiliary pixel Pa may employ a pixel circuit of FIG. 4A. Various modifications may be made.

Figure 5:
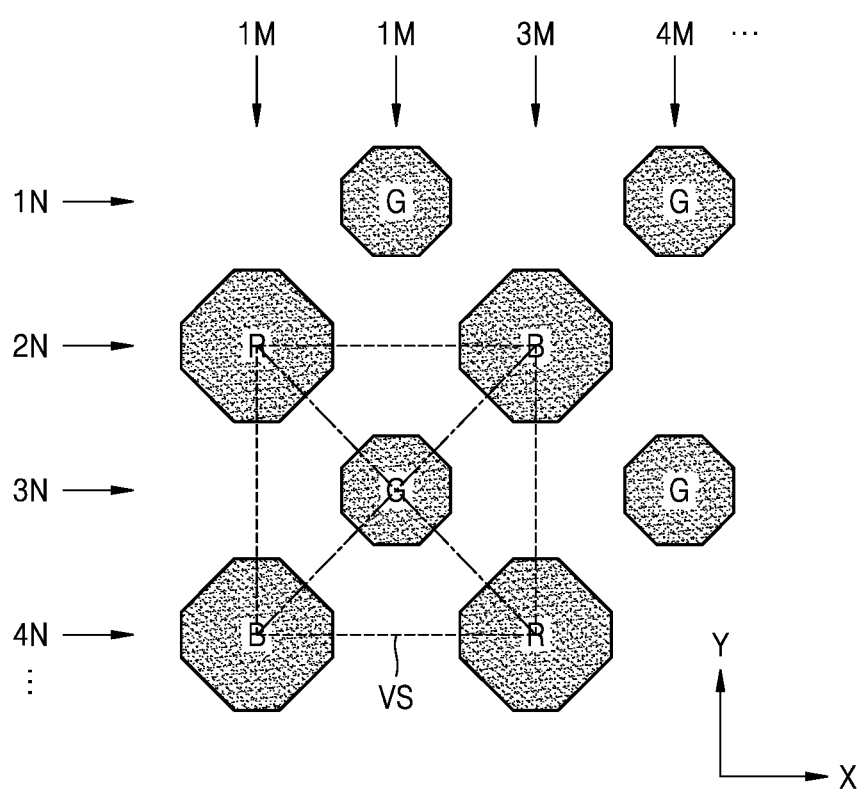
FIG. 5 is a diagram illustrating an arrangement structure of a plurality of pixels applicable to an exemplary embodiment of the present disclosure.

FIG. 5 is a diagram illustrating an example of an arrangement structure of a plurality of pixels applicable to an exemplary embodiment of the present disclosure. For example, FIG. 5 shows the arrangement relationship of emission areas of a plurality of pixels R, G, and B. In this case, the emission area of a pixel may be defined by an opening of a pixel-defining layer, which is described below.

As shown in FIG. 5, a plurality of green pixels G are spaced apart from each other with a predetermined interval on a first row 1N, a plurality of red pixels R and a plurality of blue pixels B are alternately arranged on a neighboring second row 2N, a plurality of green pixels G are spaced apart from each other with a predetermined interval on a third row 3N, and a plurality of blue pixels B and a plurality of red pixels R are alternately arranged on a neighboring fourth row 4N. Such pixel arrangement is repeated up to an N-th row. In this case, the blue pixel B and the red pixel R may be of a greater number than the green pixel G.

In this case, the plurality of green pixels G on the first row 1N are alternately arranged with the plurality of red pixels R and the plurality of blue pixels B on the second row 2N. Therefore, the red pixels R and the blue pixels B are alternately arranged on a first column 1M, the plurality of green pixels G are spaced apart from each other with a predetermined interval on a neighboring second column 2M, the blue pixels B and the red pixels R are alternately arranged on a neighboring third column 3M, and the green pixels G are spaced apart from each other with a predetermined interval on a neighboring fourth column 4M. Such pixel arrangement is repeated up to an M-the column.

The pixel arrangement may be expressed as follows, in which the red pixels R are arranged on first and third vertexes facing each other among the vertexes of a virtual quadrangle VS, and the blue pixels B are arranged on second and fourth vertexes, which are the rest of the vertexes, the virtual quadrangle VS being centered at the green pixel G. In this case, the virtual quadrangle VS may be variously modified to a rectangle, a rhombus, a square, etc.

The pixel arrangement structure, according to an exemplary embodiment of the present disclosure, is not necessarily limited thereto. For example, in FIG. 5, the blue pixel B instead of the green pixel G may be arranged at the center of the virtual quadrangle VS, the red pixels R may be arranged at the first and third vertexes facing each other among the vertexes of the virtual quadrangle VS, and the green pixels G may be arranged on the second and fourth vertexes, which are the rest of the vertexes.

Such a pixel arrangement structure is called a pentile matrix. The pentile matrix may implement high resolution with a small number of pixels by employing rendering driving in which a color is expressed by sharing neighbor pixels.

Figure 6:
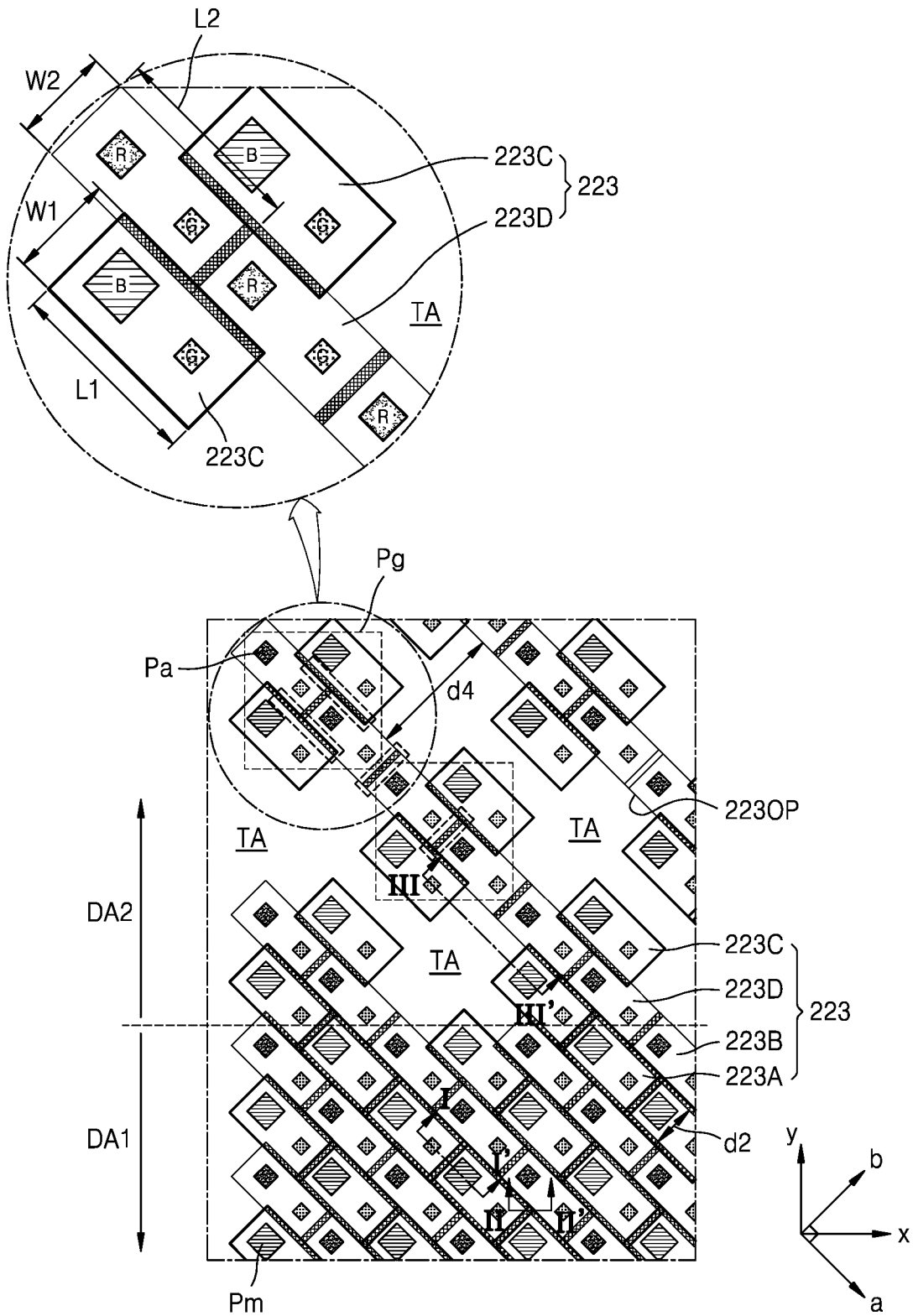
FIG. 6 is a plan view illustrating a region B of FIG. 3 showing a portion of a boundary between a first display area and a second display area.
Figure 7:
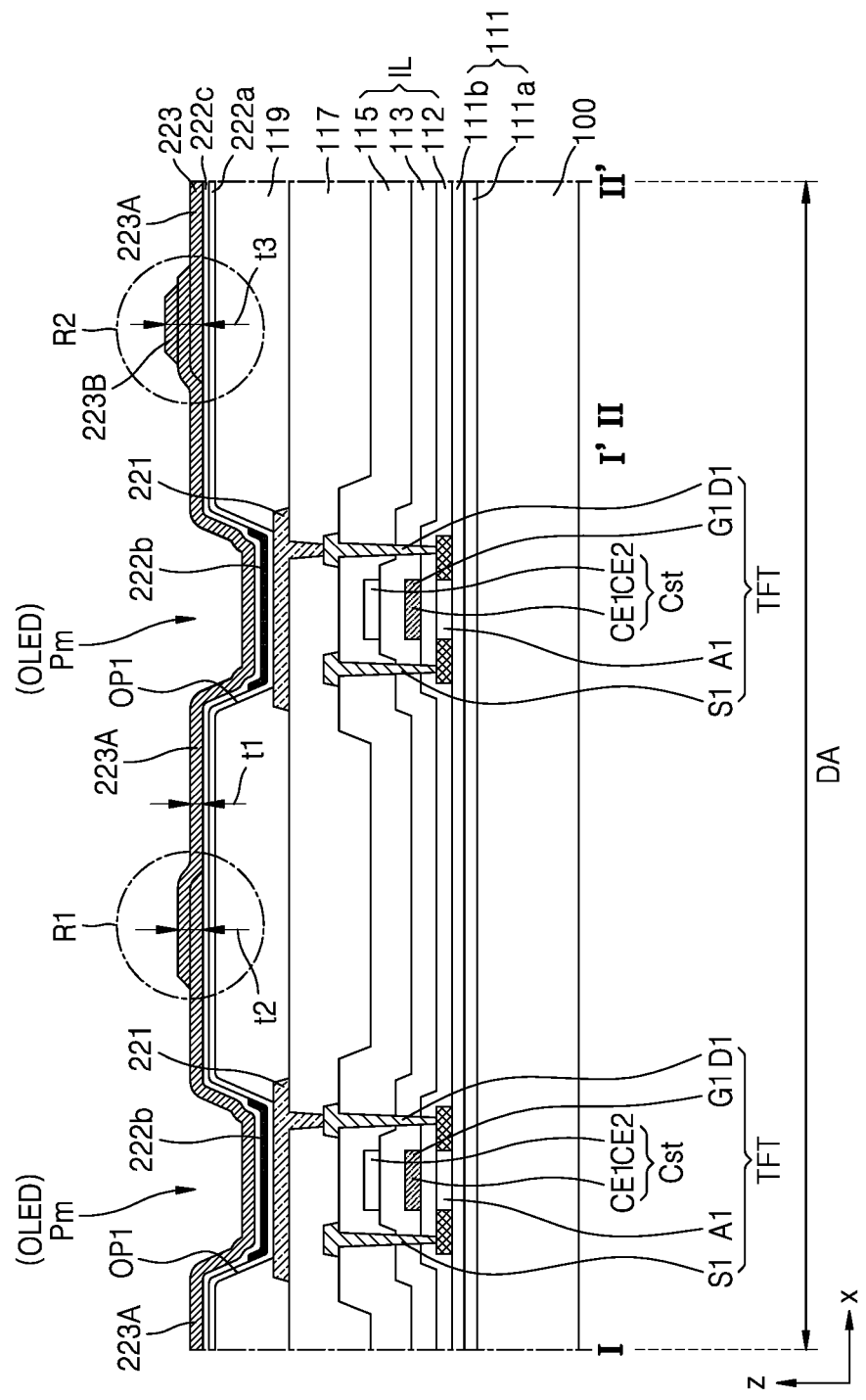
FIG. 7 is a cross-sectional view taken along lines I-I' and II-II' of FIG. 6.
Figure 8:
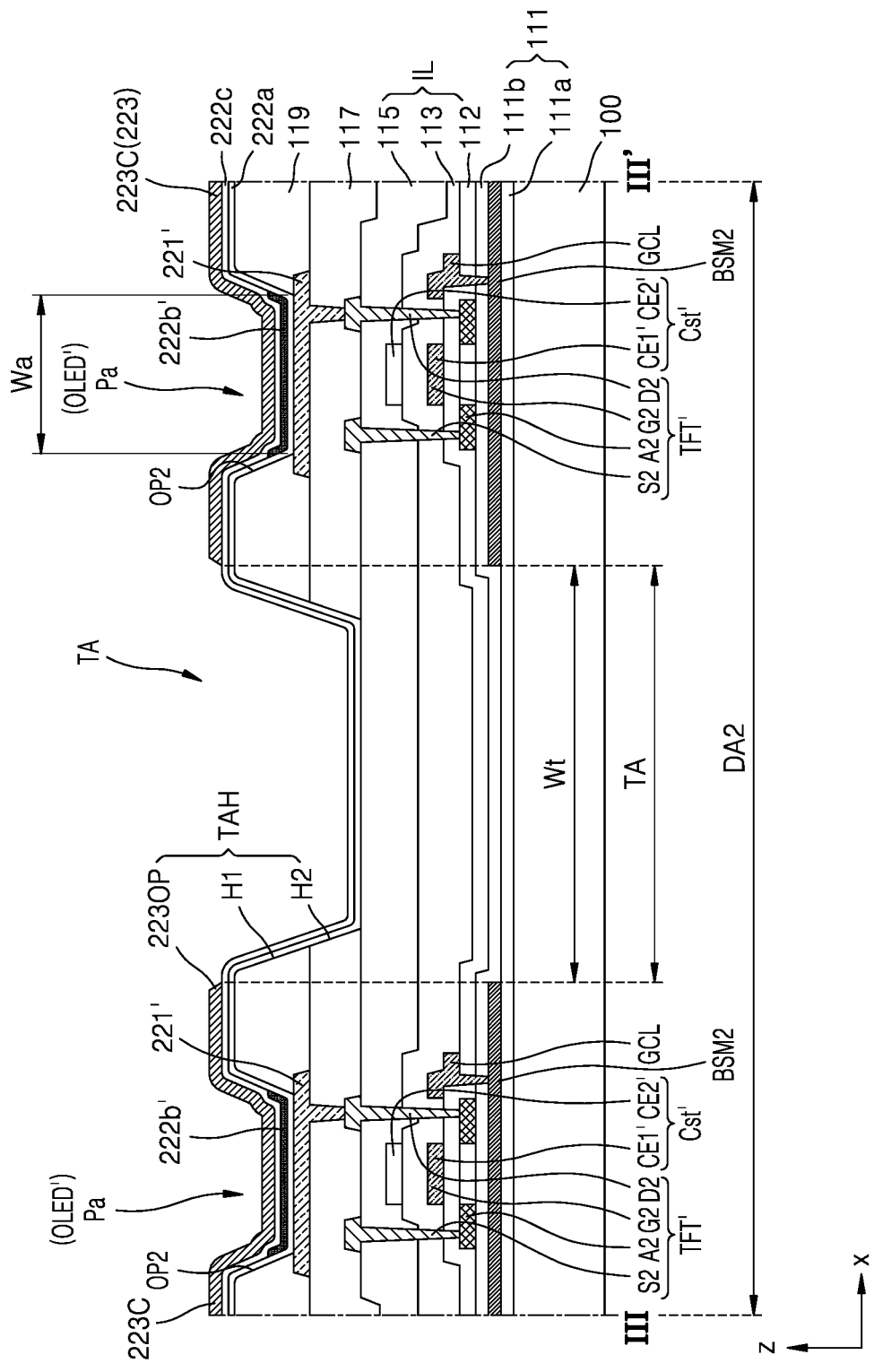
FIG. 8 is a cross-sectional view taken along line III-III' of FIG. 6.

FIG. 6 is a plan view of a region B of FIG. 3 and shows a portion of a boundary between the first display area DA1 and the second display area DA2. FIG. 7 is a cross-sectional view taken along lines I-I' and II-II' of FIG. 6. FIG. 8 is a cross-sectional view taken along line III-III' of FIG. 6.

First, referring to FIG. 6, the display apparatus, according to an exemplary embodiment of the present disclosure, includes the first display area DA1, the second display area DA2, and a plurality of opposite electrodes 223, the second display area DA2 including the transmission area TA. The opposite electrodes 223 include a plurality of first opposite electrodes 223A, a plurality of second opposite electrodes 223B, a plurality of third opposite electrodes 223C, and a plurality of fourth opposite electrodes 223D, the plurality of first opposite electrodes 223A and the plurality of second opposite electrodes 223B corresponding to the first display area DA1, and the plurality of third electrodes 223C and the plurality of fourth opposite electrodes 223D corresponding to the second display area DA2. The shape of the plurality of first opposite electrodes 223A is the same as that of the plurality of third opposite electrodes 223C. In addition, the shape of the plurality of second opposite electrodes 223B is the same as that of the plurality of fourth opposite electrodes 223D. The opposite electrodes 223 may be connected to each other, and the opposite electrode 223 may be thicker at a connection portion.

Each of the first to fourth opposite electrodes 223A, 223B, 223C, and 223D may be arranged to correspond to the same number of pixels. For example, as shown in FIG. 6, each of the first to fourth opposite electrodes 223A, 223B, 223C, and 223D may be arranged to correspond to two pixels, for example, the main pixel Pm and the auxiliary pixel Pa.

In an exemplary embodiment of the present disclosure, one first opposite electrode 223A may be arranged to correspond to one blue pixel B and one green pixel G.

In an exemplary embodiment of the present disclosure, one second opposite electrode 223B may be arranged to correspond to one red pixel R and one green pixel G.

In an exemplary embodiment of the present disclosure, one third opposite electrode 223C may be arranged to correspond to one blue pixel B and one green pixel G. In an exemplary embodiment of the present disclosure, one fourth opposite electrode 223D may be arranged to correspond to one red pixel R and one green pixel G.

Moreover, the first to fourth opposite electrodes 223A, 223B, 223C, and 223D may be provided in a rectangular shape having a long side in a direction extending in (−) 45° with respect to the x direction. Edges of the first to fourth opposite electrodes 223A, 223B, 223C, and 223D may be round.

The area of one first opposite electrode 223A may be the same as that of one third opposite electrode 223C. In addition, the area of one second opposite electrode 223B may be the same as that of one fourth opposite electrode 223D.

In contrast, the area of one first opposite electrode 223A may be greater than that of one second opposite electrode 223B because the size of the blue pixel B corresponding to the first opposite electrode 223A is greater than the size of the red pixel R corresponding to the second opposite electrode 223B. In addition, this may allow the edge of the first opposite electrode 223A and the edge of the second opposite electrode 223B to overlap each other.

Likewise, the area of one third opposite electrode 223C may be greater than that of one fourth opposite electrode 223D because the size of the blue pixel B corresponding to the third opposite electrode 223C is greater than the size of the red pixel R corresponding to the fourth opposite electrode 223D. In addition, this may allow the edge of the third opposite electrode 223C and the edge of the fourth opposite electrode 223D to overlap each other.

The third opposite electrode 223C may have a first length L1 in the a-direction and a first width W1 in a b-direction. The fourth opposite electrode 223D may have a second length L2 in the a-direction and a second width W2 in the b-direction. In this case, the first length L1 may be equal to the second length L2, and the first width W1 may be greater than the second width W2 (e.g. W1>W2).

The plurality of first opposite electrodes 223A may be arranged side by side in the a-direction inside the first display area DA1. The first opposite electrode 223A may be arranged to at least partially overlap neighboring first opposite electrodes 223A. The plurality of first opposite electrodes 223A may be spaced apart from each other in the b-direction extending in a +45° direction with respect to the x direction.

The second opposite electrodes 223B may be arranged between the plurality of first opposite electrodes 223A. In this case, the edge of the second opposite electrode 223B may at least partially overlap the edge of the first opposite electrode 223A.

The plurality of second opposite electrodes 223B may be arranged side by side in the a-direction. The second opposite electrode 223B may be arranged to at least partially overlap neighboring second opposite electrodes 223B. The plurality of second opposite electrodes 223B may be spaced apart from each other in the b-direction extending in a +45° direction with respect to the x direction. The first opposite electrode 223A may be arranged between the plurality of second opposite electrodes 223B.

For example, the first opposite electrodes 223A may be arranged in a line or the second opposite electrodes 223B may be arranged in a line in the a-direction inside the first area DA. The first opposite electrodes 223A and the second opposite electrodes 223B may be alternately arranged in the b-direction.

Because the transmission area TA is arranged in the second display area DA2, the arrangement of the opposite electrodes in the second display area DA2 may be different from the arrangement of the opposite electrodes in the first display area DA1.

The transmission area TA is a region in which display elements are not arranged and thus a light transmittance is high. The transmission area TA may be provided in plural in the second display area DA2. The transmission areas TA and pixel groups Pg may be alternately arranged, the pixel group Pg including the auxiliary pixels Pa. The pixel group Pg may include eight pixels. Alternatively, the auxiliary pixels Pa may surround the transmission area TA. The transmission area TA includes a region in which the third and fourth opposite electrodes 223C and 223D are not arranged and may mean a region of the second display area DA2 that corresponds to an opening 233OP of the opposite electrode 233. In an exemplary embodiment of the present disclosure, the transmission areas TA may be connected to each other in the a-direction.

The plurality of third opposite electrodes 223C may be spaced apart from each other inside the second display area DA2 in the a-direction and the b-direction. For example, the third opposite electrodes 223C might not overlap each other.

The plurality of fourth opposite electrodes 223D may be arranged side by side in the a-direction. The fourth opposite electrode 223D may at least partially overlap neighboring fourth opposite electrodes 223D. The plurality of fourth opposite electrodes 223D may be spaced apart from each other in the b-direction. For example, the fourth opposite electrodes 223D in the second display area DA2 may be arranged in a line in the a-direction.

A distance d4 by which the plurality of fourth opposite electrodes 223D are spaced apart from each other in the b-direction may be greater than a distance d2 by which the plurality of second opposite electrodes 223B are spaced apart from each other in the b-direction (e.g. d4>d2).

In the second display area DA2, two third opposite electrodes 223C and two fourth opposite electrodes 223D may be arranged to correspond to one pixel group Pg. The two third opposite electrodes 223C may be arranged with a separation space therebetween, and the two fourth opposite electrodes 223D may be arranged in the separation space side by side in the a-direction.

The first to fourth opposite electrodes 223A, 223B, 223C, and 223D may be electrically connected to each other. As described above, the first and second opposite electrodes 223A and 223B may overlap and contact each other by their edges, and the third and fourth opposite electrodes 223C and 223D may overlap and contact each other by their edges. In addition, in a boundary between the first display area DA1 and the second display area DA2, the first to fourth opposite electrodes 223A, 223B, 223C, and 223D may overlap and contact each other by their edges.

The first to fourth opposite electrodes 223A, 223B, 223C, and 223D may also be arranged in the non-display area NDA and may be electrically connected to the second power supply line 170 (see FIG. 3) of the non-display area NDA.

Hereinafter, a stacked structure of the display apparatus according to an exemplary embodiment of the present disclosure is described with reference to FIGS. 7 and 8. FIG. 7 is a cross-sectional view taken along lines I-I' and II-II' of FIG. 6 and shows a partial cross-section of the first display area DA1, and FIG. 8 is a cross-sectional view taken along line III-III' of FIG. 6 showing a partial cross-section of a sensor area.

Referring to FIGS. 7 and 8, the display apparatus, according to an exemplary embodiment of the present disclosure, includes the first display area DA1 and the second display area DA2. A main pixel Pm is arranged in the first display area DA1, and an auxiliary pixel Pa and the transmission area TA are arranged in the sensor area.

The main pixel Pm may include a main thin film transistor TFT, a main storage capacitor Cst, and a main organic light-emitting diode OLED. The auxiliary pixel Pa may include an auxiliary thin film transistor TFT', an auxiliary storage capacitor Cst', and an auxiliary organic light-emitting diode OLED'. The transmission area TA may include a transmission hole TAH corresponding to the transmission area TA.

Hereinafter, a structure in which elements of the display apparatus according to an exemplary embodiment of the present disclosure are stacked is described.

The substrate 100 may include glass or a polymer resin. The polymer resin may include polyethersulfone, polyacrylate, polyetherimide, polyethylene naphthalate (PEN), polyethylene terephthalate (PET), polyphenylene sulfide, polyarylate, polyimide (PI), polycarbonate, and/or cellulose acetate propionate (CAP). The substrate 100 including the polymer resin may be flexible, rollable, or bendable. The substrate 100 may have a multi-layered structure including a layer including the polymer resin and an inorganic layer.

A buffer layer III may be arranged on the substrate 100 to reduce or prevent the penetration of foreign substances, moisture, or external air from below the substrate 100 and provide a flat surface on the substrate 100. The buffer layer 111 may include an inorganic material such as an oxide or a nitride, an organic material, or an organic/inorganic composite material and have a single-layered or multi-layered structure including an inorganic material and an organic material. A barrier layer may be further arranged between the substrate 100 and the buffer layer 111, the barrier layer blocking the penetration of external air. In an exemplary embodiment of the present disclosure, the buffer layer 111 may include silicon oxide ($SiO_2$) or silicon nitride ($SiN_x$). The buffer layer 111 may include a first buffer layer 111a and a second buffer layer 111b that are stacked.

The bottom metal layer BSM may be arranged between the first buffer layer 111a and the second buffer layer 111b in the second display area DA2. In an exemplary embodiment of the present disclosure, the bottom metal layer BSM may be arranged between the substrate 100 and the first buffer layer 111a. The bottom metal layer BSM may be arranged below the auxiliary thin film transistor TFT' to prevent the characteristics of the auxiliary thin film transistor TFT' from being deteriorated by light emitted from the component 20, etc.

In addition, the bottom metal layer BSM may be connected to a wiring GCL arranged on a different layer. The bottom metal layer BSM may receive a constant voltage or signal from the wiring GCL. For example, the bottom metal layer BSM may receive the driving voltage ELVDD or a scan signal. Because the bottom metal layer BSM receives a constant voltage or signal, a probability that electrostatic discharge occurs may be reduced. The bottom metal layer BSM may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), and/or copper (Cu). The bottom metal layer BSM may include a single layer or a multi-layer including the above materials.

The main thin film transistor TFT and the auxiliary thin film transistor TFT' may be arranged on the buffer layer 111. The main thin film transistor TFT includes a first semiconductor layer A1, a first gate electrode G1, a first source electrode S1, and a first drain electrode D1. The auxiliary thin film transistor TFT' includes a second semiconductor layer A2, a second gate electrode G2, a second source electrode S2, and a second drain electrode D2. The main thin film transistor TFT may be connected to the main organic light-emitting diode OLED in the first display area DA1 to drive the main organic light-emitting diode OLED. The auxiliary thin film transistor TFT' may be connected to the auxiliary organic light-emitting diode OLED' in the second display area DA2 to drive the auxiliary organic light-emitting diode OLED'.

The first semiconductor layer A1 and the second semiconductor layer A2 may be arranged on the buffer layer III and may include polycrystalline silicon. In an exemplary embodiment of the present disclosure, the first semiconductor layer A1 and the second semiconductor layer A2 may include amorphous silicon. In an exemplary embodiment of the present disclosure, the first semiconductor layer A1 and the second semiconductor layer A2 may include an oxide of at least one of indium (In), gallium (Ga), tin (Sn), zirconium (Zr), vanadium (V), hafnium (Hf), cadmium (Cd), germanium (Ge), chromium (Cr), titanium (Ti), and zinc (Zn). Each of the first semiconductor layer A1 and the second semiconductor layer A2 may include a channel region, a source region, and a drain region, the source region and the drain region being doped with impurities.

The second semiconductor layer A2 may overlap the bottom metal layer BSM with the second buffer layer 111b therebetween. In an exemplary embodiment of the present disclosure, the width of the second semiconductor layer A2 may be less than the width of the bottom metal layer BSM. Therefore, when projected in a direction perpendicular to the substrate 100, the second semiconductor layer A2 may entirely overlap the bottom metal layer BSM.

The first semiconductor layer A1 and the second semiconductor layer A2 may cover a first gate insulating layer 112. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may include a single layer or a multi-layer including the above inorganic insulating materials.

The first gate electrode G1 and the second gate electrode G2 are arranged on the first gate insulating layer 112 to respectively overlap the first semiconductor layer A1 and the second semiconductor layer A2. The first gate electrode G1 and the second gate electrode G2 may include molybdenum (Mo), aluminum (Al), copper (Cu), and/or titanium (Ti) and include a single layer or a multi-layer. For example, each of the first gate electrode G1 and the second gate electrode G2 may include a single Mo layer.

A second gate insulating layer 113 may cover the first gate electrode G1 and the second gate electrode G2. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 113 may include a single layer or a multi-layer including the above inorganic insulating materials.

A first top electrode CE2 of a main storage capacitor Cst and a second top electrode CE2' of an auxiliary storage capacitor Cst' may be arranged on the second gate insulating layer 113.

In the first display area DA1, the first top electrode CE2 may overlap the first gate electrode G1 therebelow. The first gate electrode G1 and the first top electrode CE2 overlapping each other with the second gate insulating layer 113 therebetween may constitute the main storage capacitor Cst. For example, the first gate electrode G1 may serve as a first bottom electrode CE1 of the main storage capacitor Cst.

In the second display area DA2, the second top electrode CE2 may overlap the second gate electrode G2 therebelow. The second gate electrode G2 and the second top electrode CE2' overlapping each other with the second gate insulating layer 113 therebetween may constitute the auxiliary storage capacitor Cst'. The second gate electrode G2 may serve as the second bottom electrode CE1' of the auxiliary storage capacitor Cst'.

The first top electrode CE2 and the second top electrode CE2' may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu) and include a single layer or a multi-layer including the above materials.

An interlayer insulating layer 115 may cover the first top electrode CE2 and the second top electrode CE2'. The interlay insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The first and second source electrodes S1 and S2 and the first and second drain electrodes D1 and D2 may be arranged on the interlayer insulating layer 115. The first and second source electrodes S1 and S2 and the first and second drain electrodes D1 and D2 may include a conductive material including molybdenum (Mo), aluminum (A), copper (Cu), and titanium (Ti) and include a single layer or a multi-layer including the above materials. For example, the first and second source electrodes S1 and S2 and the first and second drain electrodes D1 and D2 may have a multi-layered structure of Ti/AL/Ti. In an exemplary embodiment of the present disclosure, at least one of the first and second source electrodes S1 and S2 and the first and second drain electrodes D1 and D2 may be omitted. In this case, the source region and the drain region on two opposite sides of the channel region of the first and second semiconductor layers A1 and A2 may respectively serve as a source electrode and a drain electrode.

A planarization layer 117 may cover the first and second source electrodes S1 and S2 and the first and second drain electrodes D1 and D2. The planarization layer 117 may have a flat top surface such that a first pixel electrode 221 and a second pixel electrode 221' arranged thereon are formed flat.

The planarization layer 117 may include a single layer or a multi-layer including an organic material or an inorganic material. The planarization layer 117 may include a general-purpose polymer such as benzocyclobutene (BCB), polyimide, hexamethyldisiloxane (HMDSO), polymethyl methacrylate or polystyrene, polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The planarization layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). After the planarization layer 117 is formed, chemical mechanical polishing may be performed to provide a flat upper surface.

The planarization layer 117 includes an opening that exposes one of the first source electrode S1 and the first drain electrode D1 of the main thin film transistor TFT. The first pixel electrode 221 may be electrically connected to the main thin film transistor TFT by contacting the first source electrode S1 or the first drain electrode D1 through the opening.

In addition, the planarization layer 117 includes an opening that exposes one of the second source electrode S2 and the second drain electrode D2 of the auxiliary thin film transistor TFT'. The second pixel electrode 221' may be electrically connected to the auxiliary thin film transistor TFT' by contacting the second source electrode S2 or the second drain electrode D2 through the opening.

The first pixel electrode 221 and the second pixel electrode 221' may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an exemplary embodiment of the present disclosure, the first pixel electrode 221 and the second pixel electrode 221' may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. In an exemplary embodiment of the present disclosure, the first pixel electrode 221 and the second pixel electrode 221' may further include a layer including ITO, IZO, ZnO, or $In_2O_3$ on/under the reflective layer. In an exemplary embodiment of the present disclosure, the first pixel electrode 221 and the second pixel electrode 221' may have a structure of ITO/Ag/ITO that are stacked.

A pixel-defining layer 119 may cover the edge of each of the first pixel electrode 221 and the second pixel electrode 221'. The pixel-defining layer 119 overlaps each of the first pixel electrode 221 and the second pixel electrode 221' and includes a first opening OP1 and a second opening OP2 each defining an emission area of a pixel. The pixel-defining layer 119 may prevent electrical arcing, etc. from occurring at the edges of the first pixel electrode 221 and the second pixel electrode 221 by increasing a distance between the edges of the first pixel electrode 221 and the second pixel electrode 221' and an opposite electrode 223 over the first pixel electrode 221 and the second pixel electrode 221'. The pixel-defining layer 119 may be formed through spin coating, etc. by using an organic insulating material such as polyimide, polyamide, an acrylic resin, BCB, and HMDSO.

A first functional layer 222a may be arranged on portions of the first pixel electrode 221 and the second pixel electrode 221' that are exposed by the openings OP1 and OP2. The first functional layer 222a may extend to a top surface of the pixel-defining layer 119. The first functional layer 222a may include a single layer or a multi-layer. The first functional layer 222a may include a hole transport layer (HTL), which has a single-layered structure. Alternatively, the first functional layer 222a may include a hole injection layer (HIL) and a hole transport layer (HTL). The first functional layer 222a may be formed as one body to correspond to the main pixels Pm and the auxiliary pixels Pa included in the first display area DA1 and the second display area DA2.

A first emission layer 222b and a second emission layer 222b' may be arranged on the first functional layer 222a, the first emission layer 222b and the second emission layer 222b' respectively corresponding to the first pixel electrode 221 and the second pixel electrode 221'. The first emission layer 222b and the second emission layer 222b' may include a polymer material or a low molecular weight material and emit red, green, blue, or white light.

A second functional layer 222c may be formed on the first emission layer 222b and the second emission layer 222b'. The second functional layer 222c may include a single layer or a multi-layer. The second functional layer 222c may include an electron transport layer (ETL) and/or an electron injection layer (EIL). The second functional layer 222c may be formed as one body to correspond to the main pixels Pm and the auxiliary pixels Pa included in the first display area DA1 and the second display area DA2. The first functional layer 222a and/or the second functional layer 222c may be omitted.

The opposite electrode 223 is arranged on the second functional layer 222c. The opposite electrode 223 may include a conductive material having a low work function. As used herein, "low work function" is intended to mean any material having a work function that is equal to or lower than that of any of the materials listed below as examples of low work function materials. For example, the opposite electrode 223 may include a transparent or semitransparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the opposite electrode 223 may further include a layer on the (semi) transparent layer including the above material, the layer including ITO, IZO, ZnO, or $In_2O_3$.

As described above, the opposite electrode 223 includes the first opposite electrode 223A and the second opposite electrode 223B arranged in the first display area DA1. In addition, the opposite electrode 223 includes the third opposite electrode 223C and the fourth opposite electrode 223D (see FIG. 6) arranged in the second display area DA2.

First opposite electrodes 223A neighboring each other among the first opposite electrodes 223A may overlap and contact each other by their edges. The overlapping portion may be formed between the main pixels Pm (a region R1 of FIG. 7). One edge of the first opposite electrodes 223A may overlap the second opposite electrodes 223B, and a region in which two first opposite electrodes 223A overlap one second opposite electrode 223B may be provided (A region R2 of FIG. 7).

The thickness of the opposite electrode 223 in the overlapping region is greater than the thickness of the central region of each first opposite electrodes 223A.

For example, in the case where the first opposite electrode 223A has a first thickness t1, the thickness of the opposite electrode 223 in the region R1 may be a second thickness t2 greater than the first thickness t1, the region R1 being a region in which the first opposite electrode 223A overlaps the neighboring first opposite electrode 223A. The second thickness t2 may be about twice the first thickness t1.

In addition, the thickness of the opposite electrode 223 in the region R2 may be a third thickness t3 greater than the second thickness t2, the region R2 being a region in which two first opposite electrodes 223A overlap one second opposite electrode 223B. The third thickness t3 may be about three times the first thickness t1.

Some of the third opposite electrodes 223C may be spaced apart from each other with the transmission area TA therebetween in the second display area DA2. In this case, a separation space between the third opposite electrodes 223C may be understood as an opening 223OP of the opposite electrode 223. The opening 223OP may include the transmission hole TAH through which light passes. The transmission hole TAH may further include a first hole H1 and/or a second hole H2, the first hole H1 being defined in the pixel-defining layer 119, and the second hole H2 being defined in the planarization layer 117.

The pixel-defining layer 119 may include the first hole H1 corresponding to the transmission area TA. The first hole H1 may overlap the opening 223OP of the opposite electrode 223. Though it is shown in the drawing that the bottom width of the opening 223OP is greater than the bottom width of the first hole H1, the present invention is not necessarily limited thereto. For example, because the opposite electrode 223 may extend up to an inner wall of the transmission hole TAH, the width of the opening 223OP may be less than the width of the first hole H1.

The planarization layer 117 may include the second hole H2 corresponding to the transmission area TA. The second hole 112 may overlap the opening 223OP of the opposite electrode 223. Though it is shown in the drawing that the bottom width of the first hole H1 is greater than the bottom width of the second hole H2, the present invention is not necessarily limited thereto. For example, because the pixel-defining layer 119 covers the edge of the second hole H2 of the planarization layer 117, the width of the first hole H1 may be less than the width of the second hole H2.

Because the first hole H1 and/or the second hole H2 are formed, a light transmittance of the transmission area TA may be increased even more. Though it is shown in the drawing that both the first hole H1 and the second hole H2 are formed, the present invention is not necessarily limited thereto. For example, only one of the first hole H1 and the second hole H2 each corresponding to the transmission area TA may be provided. Various modifications may be made. The first functional layer 222a and the second functional layer 222c may be arranged inside the transmission hole TAH.

A width Wt of the transmission hole TAH may be greater than a width Wa of an emission area defined by the second opening OP2 of the pixel-defining layer 119. When the transmission hole TAH is formed, it means that a member such as the opposite electrode 223 corresponding to the transmission area TA is removed. Therefore, a light transmittance of the transmission area TA may be remarkably increased.

A capping layer may be formed on the opposite electrode 223, the capping layer increasing a light extraction efficiency while protecting the opposite electrode 223. The capping layer may include lithium fluoride (LiF). Alternatively, the capping layer may include an inorganic insulating material such as silicon nitride and/or include an organic insulating material. In an exemplary embodiment of the present disclosure, the capping layer may be omitted.

Figure 9:
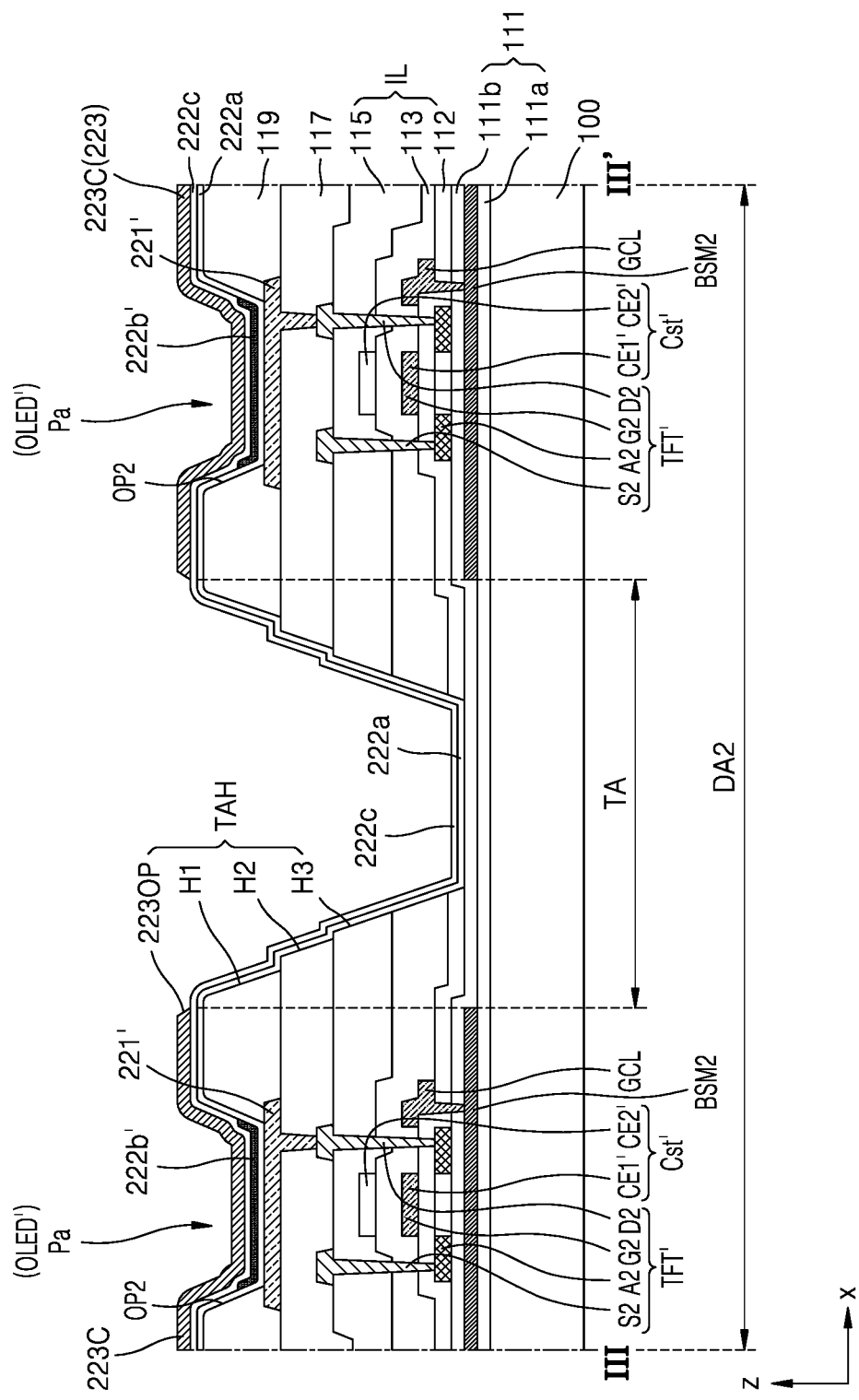
FIG. 9 is a cross-sectional view illustrating a display apparatus according to an exemplary embodiment of the present disclosure.

FIG. 9 is a cross-sectional view illustrating the display apparatus according to an exemplary embodiment of the present disclosure. FIG. 9 may be a cross-sectional view of the display apparatus taken along line III-III' of FIG. 6. In FIG. 9, to the extent that a detailed description of certain elements has been omitted, it may be assumed that these elements are at least similar to corresponding elements of FIG. 8.

Referring to FIG. 9, the transmission hole TAH may further include a third hole H3 corresponding to the transmission area TA.

Assuming that the first gate insulating layer 112, the second gate insulating layer 113, and the interlayer insulating layer 115 are collectively referred to as an inorganic insulating layer IL, the inorganic insulating layer IL may include the third hole H3 corresponding to the transmission area TA. The third hole H3 may expose a top surface of the buffer layer 111 or the substrate 100. The third hole H3 may include the first opening of the first gate insulating layer 112, the second opening of the second gate insulating layer 113, and a third opening of the interlayer insulating layer 115 that overlap one another. The first to third openings may be individually formed through separate processes or simultaneously formed through the same process. Alternatively, the first opening and the second opening may be simultaneously formed and the third opening may be separately formed. Various modifications may be made. In the case where the first to third openings are formed through separate processes, a step difference may be formed on a lateral surface of the third hole H3.

The inorganic insulating layer IL may include a groove rather than the third hole H3 exposing the buffer layer 111. For example, the first gate insulating layer 112 of the inorganic insulating layer IL may be continuously arranged to correspond to the transmission area TA. The second gate insulating layer 113 and the interlayer insulating layer 115 may respectively include the second opening and the third opening each corresponding to the transmission area TA.

Alternatively, the first gate insulating layer 112 and the second gate insulating layer 113 may be continuously formed to correspond to the transmission area TA. The interlayer insulating layer 115 may include the third opening corresponding to the transmission area TA. Various modifications may be made.

Because the inorganic insulating layer IL, the planarization layer 117, and the pixel-defining layer 119 may have transmittance based on which the component 20 may transmit/receive light, holes corresponding to the transmission area TA might not be provided. However, in the case where the inorganic insulating layer IL, the planarization layer 117, and the pixel-defining layer 119 include holes corresponding to the transmission area TA, a light transmittance may be increased even more.

Figure 10A:
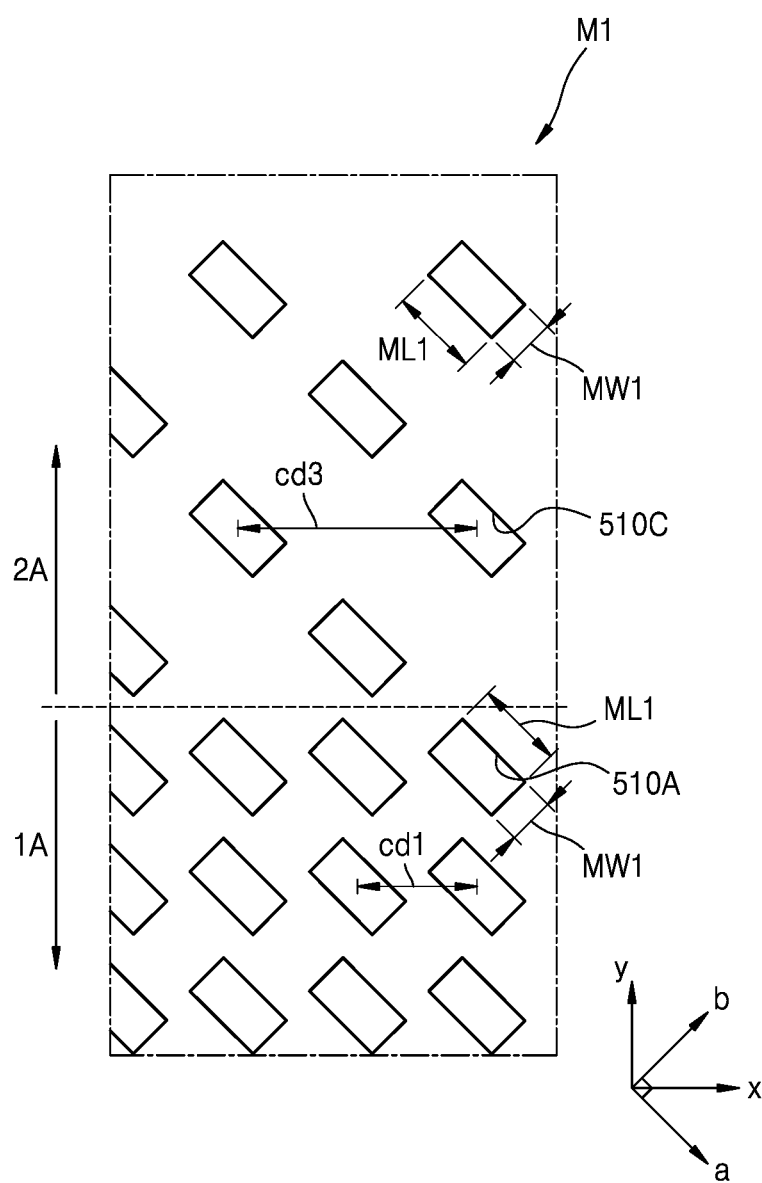
FIGS. 10A and 10B are diagrams illustrating an example of a mask for forming an opposite electrode according to an exemplary embodiment of the present disclosure.

FIGS. 10A and 10I are diagrams illustrating an example of a mask for forming an opposite electrode according to an exemplary embodiment of the present disclosure, and FIGS. 11A to 11D are diagrams illustrating a manufacturing method using the mask.

Referring to FIG. 10A, a first mask M1, according to an exemplary embodiment of the present disclosure, includes a first mask opening 510A and a third mask opening 510C each having the same shape.

The first mask opening 510A may be provided in a quadrangular shape having a first mask width MW1 in the b-direction and a first mask length ML1 in the a-direction. The third mask opening 510C may be provided in a quadrangular shape having the first mask width MW1 in the b-direction and the first mask length ML1 in the a-direction. The first mask length ML1 may be at least twice as large as the first mask width MW1.

The first mask openings 510A may be spaced apart from each other and regularly arranged (e.g. arranged at regular intervals) in the x direction and the y direction in a first area 1A of the first mask M1. The third mask openings 510C may be spaced apart from each other and regularly arranged (e.g. arranged at regular intervals) in the x direction and the y direction in a second area 2A of the first mask M1.

In this case, a distance cd1 between centers of the first mask openings 510A neighboring in the x direction may be less a distance cd3 between centers of the third mask openings 510C neighboring in the x direction.

In an exemplary embodiment of the present disclosure, the first mask openings 510A may be designed for depositing the first opposite electrode 223A (see FIG. 6) corresponding to the blue pixel B and the green pixel G arranged in the first display area DA1, and the third mask openings 510C may be designed for depositing the third opposite electrode 223C (see FIG. 6) corresponding to the blue pixel B and the green pixel G arranged in the second display area DA2.

The first mask M1 may includes a mask used for depositing the opposite electrode 233 (see FIG. 6) and may include a fine metal mask (FMM). The FMM may be manufactured by forming a hole in a metal plate and drawing and stretching (tensioning) the metal plate. When the shapes and areas of the first mask opening 510A and the third mask opening 510C are designed different from each other, it may be difficult to manufacture the sizes of the first mask opening 510A and the third mask opening 510C according to the designed sizes during a process of tensioning the first mask.

In contrast, because the first mask opening 510A and the third mask opening 510C of the first mask M1 have the same shape and the same area, a process error during a tension process may be reduced.

Figure 10B:
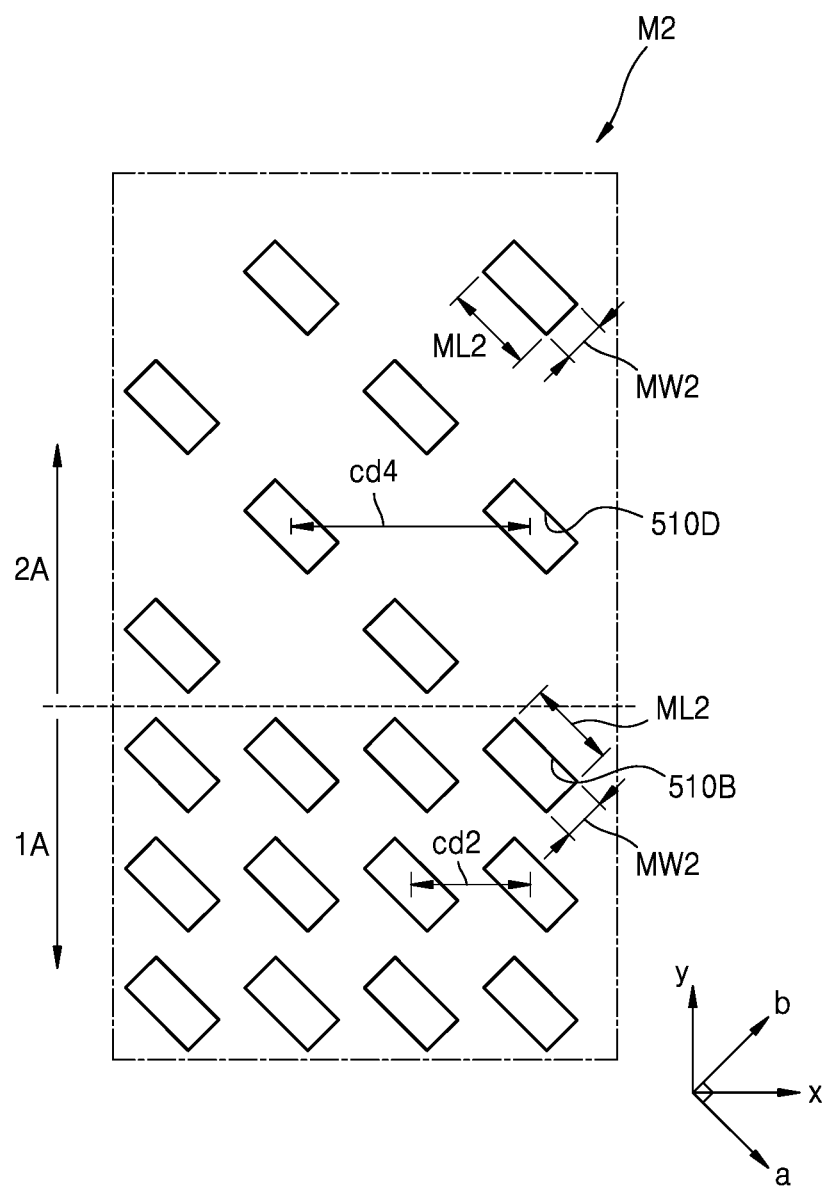

Referring to FIG. 10B, a second mask M2, according to an exemplary embodiment of the present disclosure, includes a second mask opening 510B and a fourth mask opening 510D each having the same shape.

The second mask opening 510B may be provided in a quadrangular shape having a second mask width MW2 in the b-direction and a second mask length ML2 in the a-direction. The fourth mask opening 510D may be provided in a quadrangular shape having the second mask width MW2 in the b-direction and the second mask length ML2 in the a-direction. The second mask length ML2 may be at least twice as large as the second mask width MW2.

The second mask openings 510B may be spaced apart from each other and regularly arranged (e.g. arranged at regular intervals) in the x direction and the y direction in the first area 1A of the second mask M2. The fourth mask openings 510D may be spaced apart from each other and regularly arranged (e.g. arranged at regular intervals) in the x direction and the y direction in the second area 2A of the second mask M2.

In this case, a distance cd2 between centers of the second mask openings 510B neighboring in the x direction may be less a distance cd4 between centers of the fourth mask openings 510D neighboring in the x direction.

In an exemplary embodiment of the present disclosure, the second mask openings 510B may be designed for depositing the second opposite electrode 223B (see FIG. 6) corresponding to the red pixel R and the green pixel G arranged in the first display area DA1, and the fourth mask openings 510D may be designed for depositing the fourth opposite electrode 223D (see FIG. 6) corresponding to the red pixel R and the green pixel G arranged in the second display area DA2.

Because the second mask opening 510B and the fourth mask opening 510D of the second mask M2 have the same shape and the same area, a process error during a tensioning process may be reduced.

The shapes and/or the sizes of the first mask opening 510A of the first mask M1 and the second mask opening 510B of the second mask M2 may be different from each other. In an exemplary embodiment of the present disclosure, the area of the first mask opening 510A may be greater than the area of the second mask opening 510B of the second mask M2. In an exemplary embodiment of the present disclosure, the first mask width MW1 may be greater than the second mask width MW2.

The opposite electrode 223 may be formed by using 4-step deposition that uses the first mask M1 and the second mask M2. FIGS. 11A to 11D show a method of depositing the opposite electrode 223 by using the first mask M1 and the second mask M2.

Figure 11A:
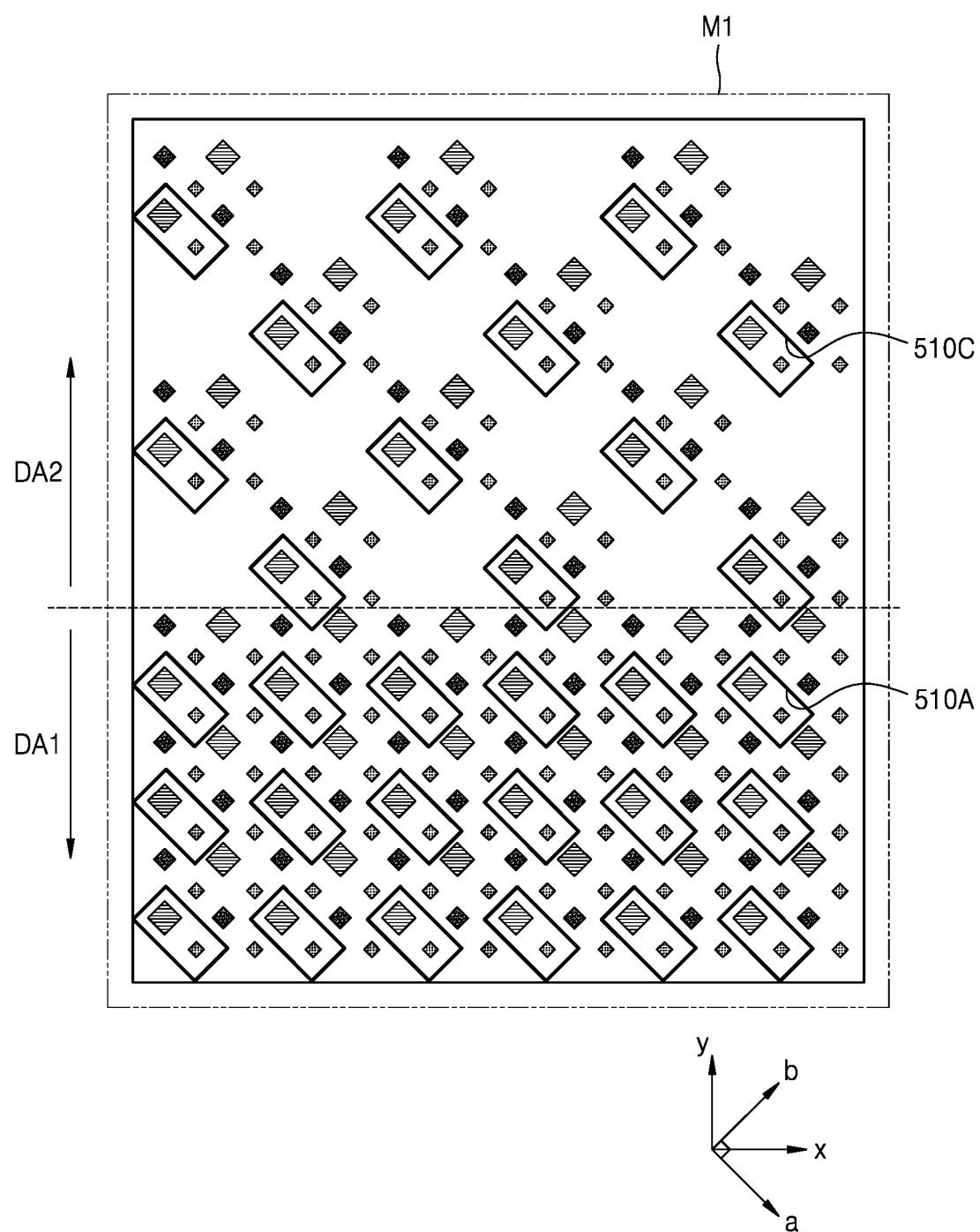
FIGS. 11A to 11D are diagrams illustrating a manufacturing method using the mask of FIGS. 10A and 10B.

Referring to FIG. 11A, after the second functional layer 222c (see FIG. 7) is formed over the substrate 100, the first mask M1 is arranged such that the first mask opening 510A of the first mask M1 corresponds to the blue pixel B and the green pixel G in the first display area DA1, and the third mask opening 510C corresponds to the blue pixel B and the green pixel G in the second display area DA2.

Next, a portion of the opposite electrode 223 is primarily deposited on the second functional layer 222c by emitting a deposition material to be formed as the opposite electrode from a deposition source. In this case, only a portion of the first to third opposite electrodes 223A and 223C is formed according to the arrangement of the first and third mask openings 510A and 510C of the first mask M1.

Figure 11B:
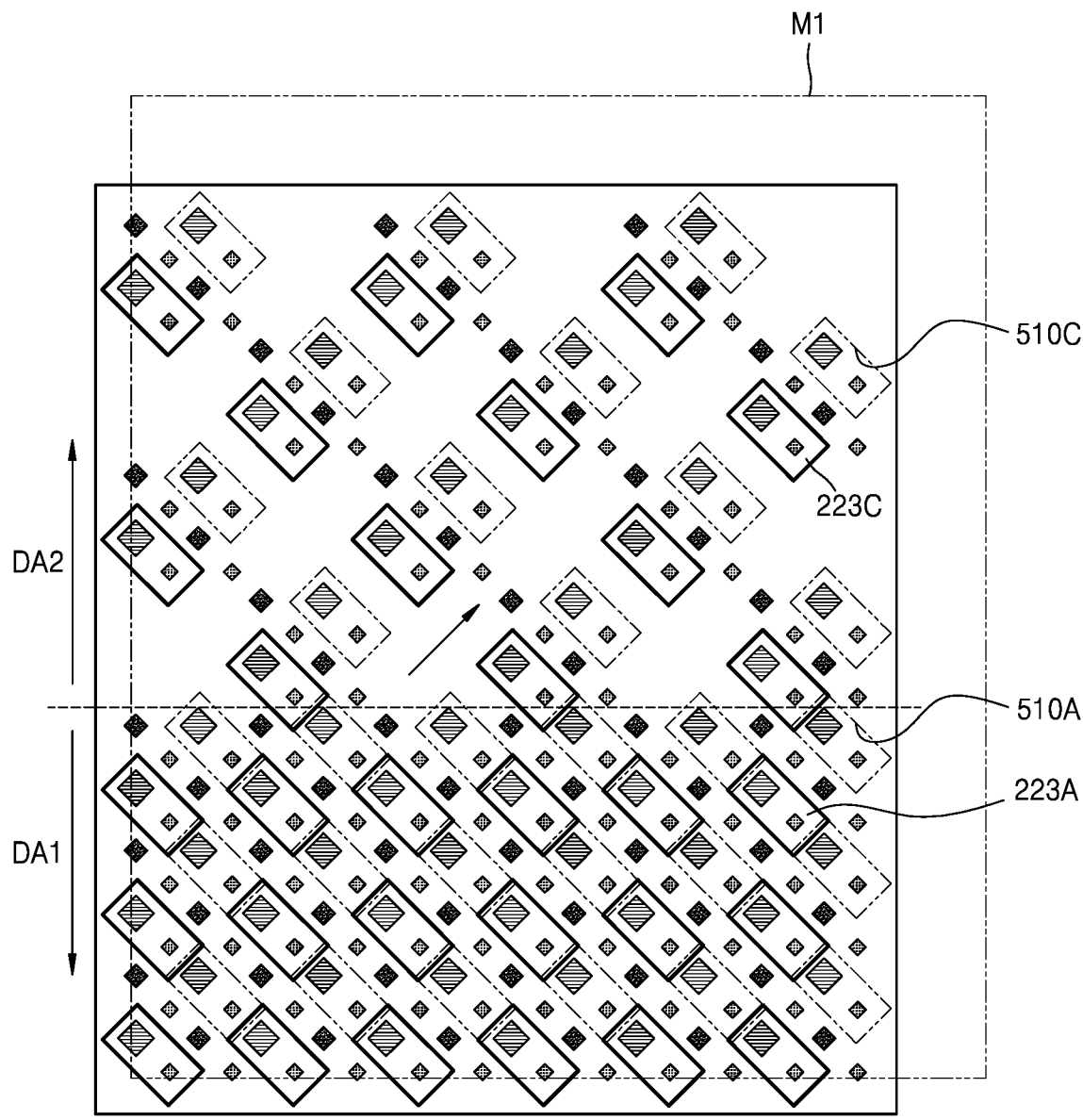

Next, as shown in FIG. 11B, by moving the position of the first mask M1 in the x direction and the y direction, the first mask M1 is arranged such that the first mask opening 510A of the first mask M1 corresponds to the blue pixel B and the green pixel G in the first display area DA1, and the third mask opening 510C corresponds to the blue pixel B and the green pixel G in the second display area DA2. For example, after the opposition electrode 223 is primarily deposited, secondary deposition of the opposite electrode 223 may be performed by moving the arrangement of the first mask M1 in an upper right direction. Alternatively, after the opposition electrode 223 is primarily deposited, secondary deposition of the opposite electrode 223 may be performed by moving the arrangement of the first mask M1 in a lower left direction. Assuming that the substrate 100 has a width in the x direction and a length in the y direction in a plan view, it may be understood that the first mask M1 is moved and arranged in a diagonal direction of the substrate 100 before the secondary deposition is performed.

Next, a portion of the opposite electrode 223 is secondarily deposited by using the deposition source. In this case, the first opposite electrodes 223A formed during the second deposition in the first display area DA1 may overlap and contact, by their edges, the first opposite electrode 223A formed during the primary deposition. The third opposite electrodes 223C formed during the secondary deposition in the second display area DA2 may be spaced apart from the third opposite electrodes 223C formed during the primary deposition.

Figure 11C:
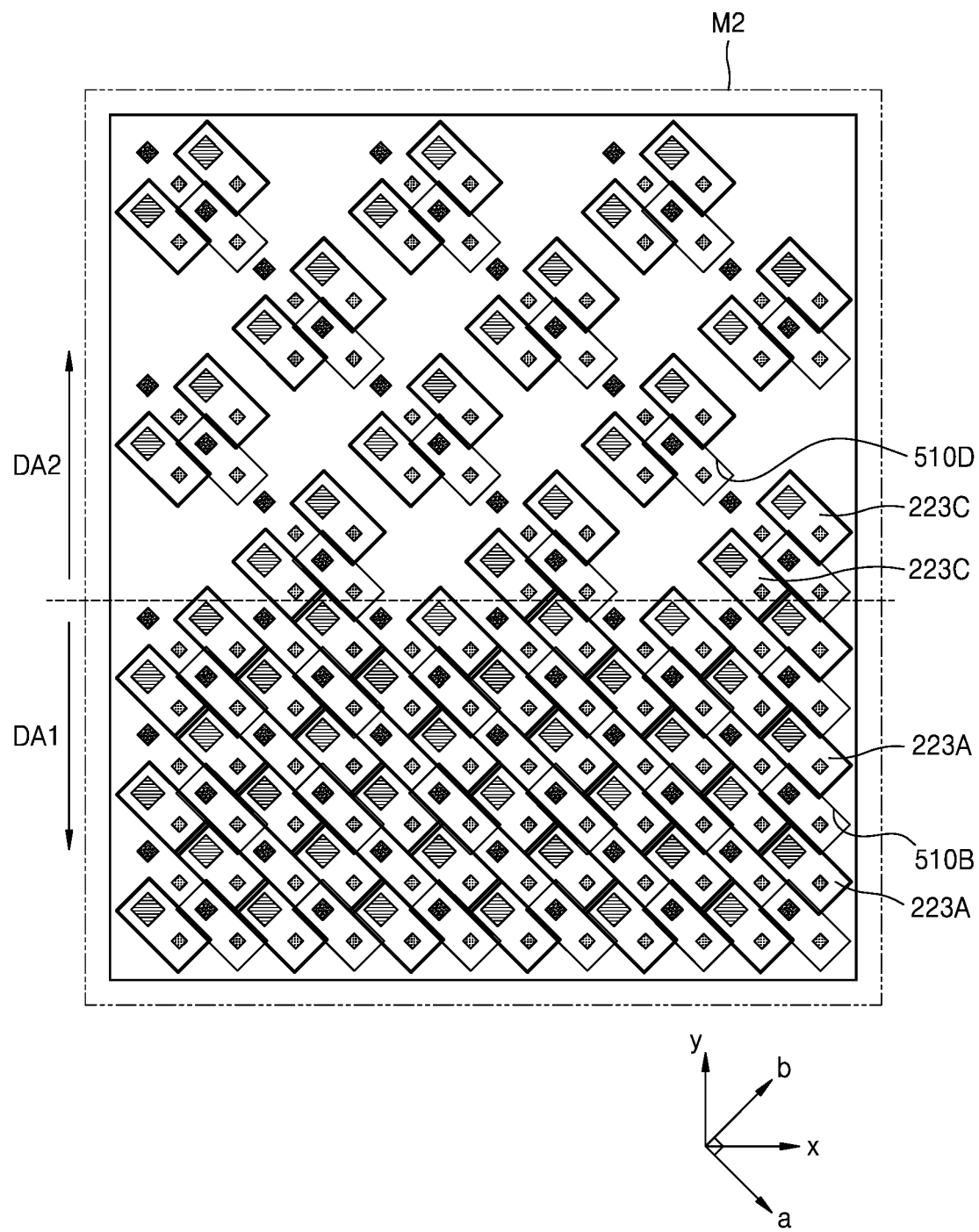

Next, as shown in FIG. 11C, the second mask M2 is arranged such that the second mask opening 510B of the second mask M2 corresponds to the red pixel R and the green pixel G in the first display area DA1, and the fourth mask opening 510D corresponds to the red pixel R and the green pixel G in the second display area DA2.

Next, a portion of the opposite electrode 223 is thirdly deposited by using the deposition source. In this case, only a portion of the second and fourth opposite electrodes 223B and 223D is formed according to the arrangement of the second and fourth mask openings 510B and 510D of the second mask M2. The edges of the second opposite electrodes 223B formed during the third deposition may overlap and contact the edges of the first opposite electrodes 223A in the first display area DA1. The edges of the fourth opposite electrodes 223D formed during the third deposition may overlap and contact the edges of the third opposite electrodes 223C in the second display area DA2.

Figure 11D:
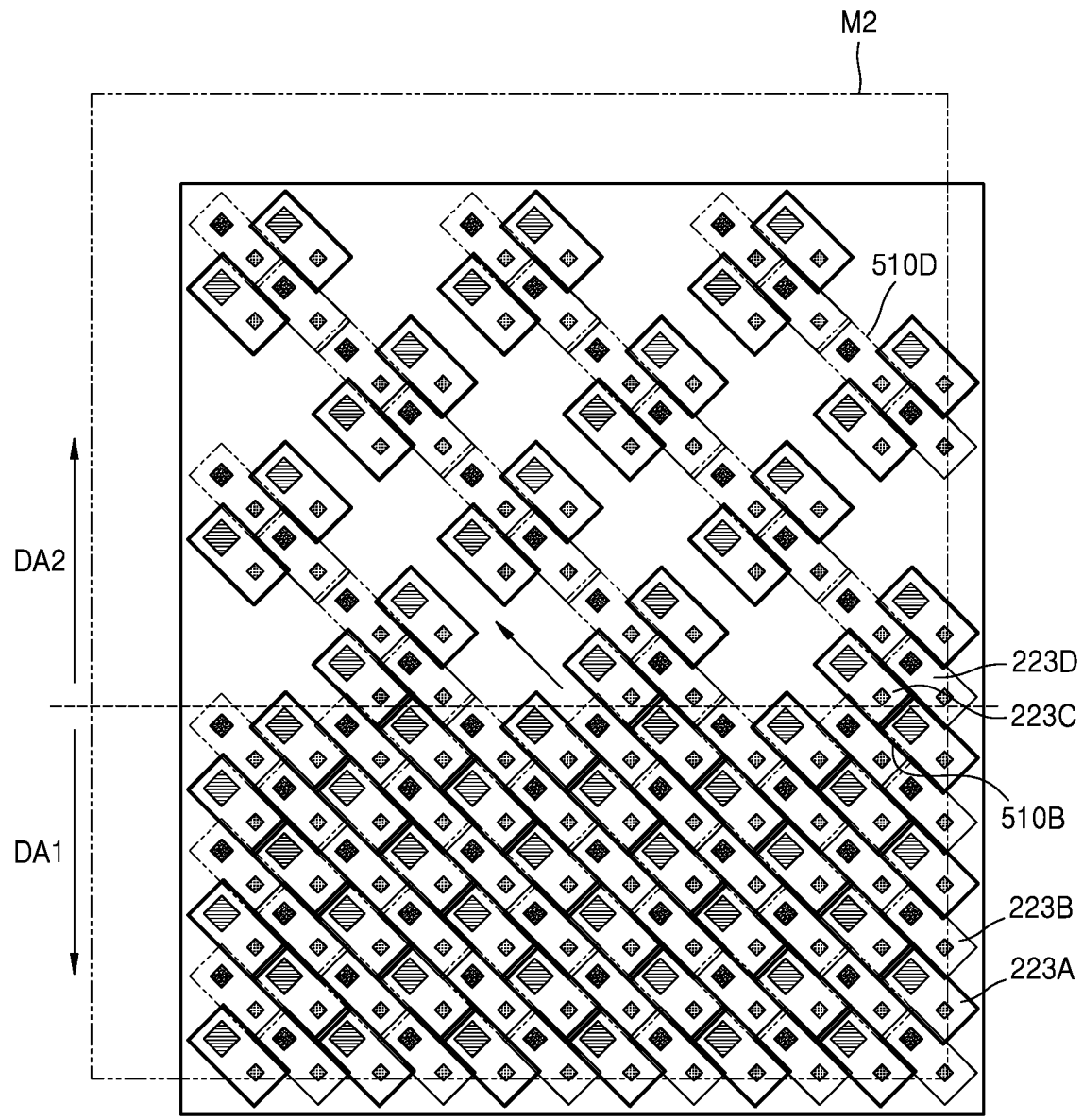

Next, as shown in FIG. 11D, by moving the position of the second mask M2 in a (−) x direction and the y direction, the second mask M2 is arranged such that the second mask opening 510B of the second mask M2 corresponds to the red pixel R and the green pixel G in the first display area DA1, and the fourth mask opening 510D corresponds to the red pixel R and the green pixel G in the second display area DA2. For example, after the third deposition of the opposite electrode 223, fourth deposition of the opposite electrode 223 may be performed by moving the second mask M2 in an upper left direction. Alternatively, after the third deposition of the opposite electrode 223, the fourth deposition of the opposite electrode 223 may be performed by moving the second mask M2 in a lower right direction. It may be understood that the second mask M2 is moved and arranged in a diagonal direction of the substrate 100 before the fourth deposition is performed.

As described above, when the first mask M1 and the second mask M2 according to an exemplary embodiment of the present disclosure are used, because the opposite electrode 223 is deposited twice by using one mask M1 (or M2), a process time and a process cost may be reduced compared to the process in which four masks are used.

Figure 12:
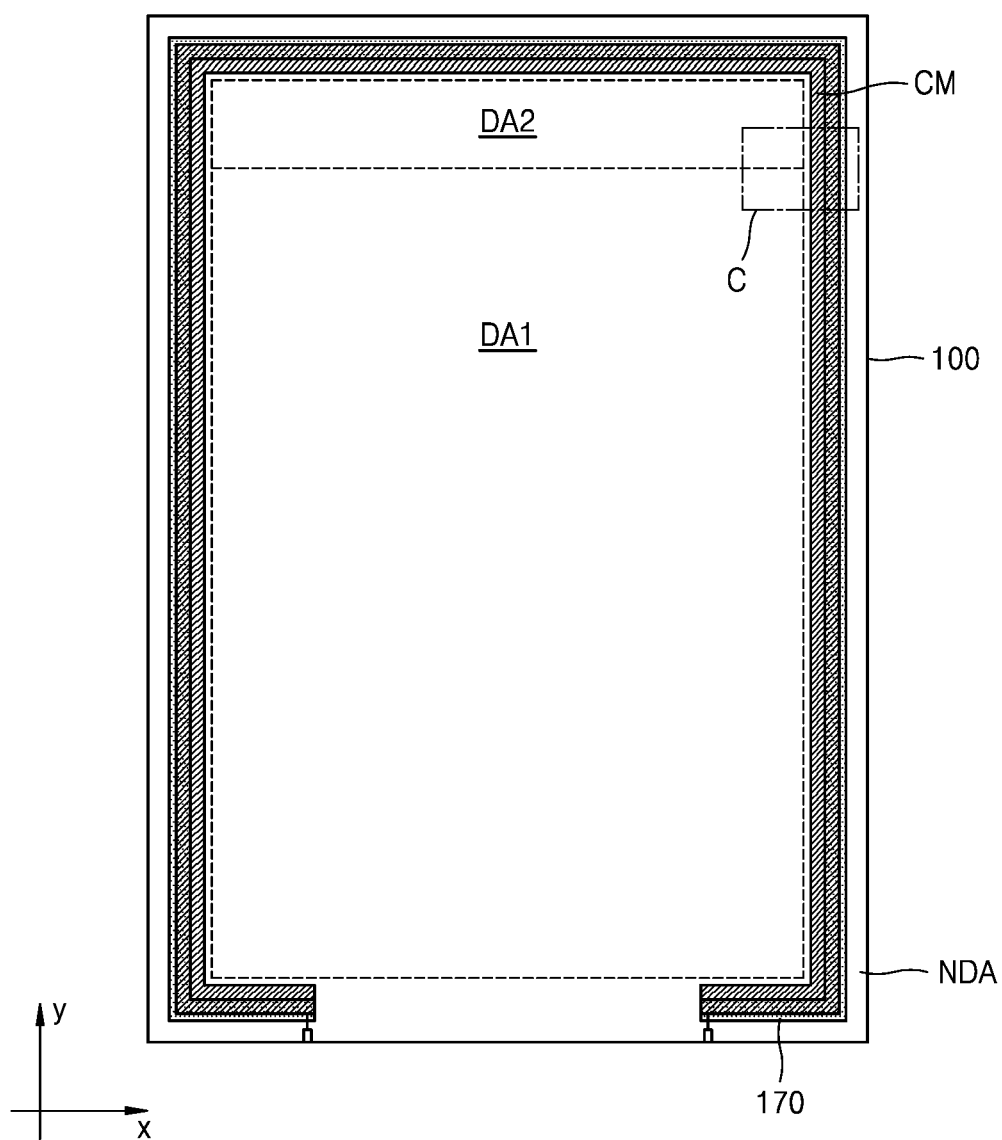
FIG. 12 is a plan view illustrating a display apparatus according to an exemplary embodiment of the present disclosure.

In the display apparatus that employs the above deposition method according to an exemplary embodiment of the present disclosure, the opposite electrode formed in the non-display area NDA may be electrically connected to the second power supply line 170 through a connection line CM as shown in FIG. 12.

Figure 13A:
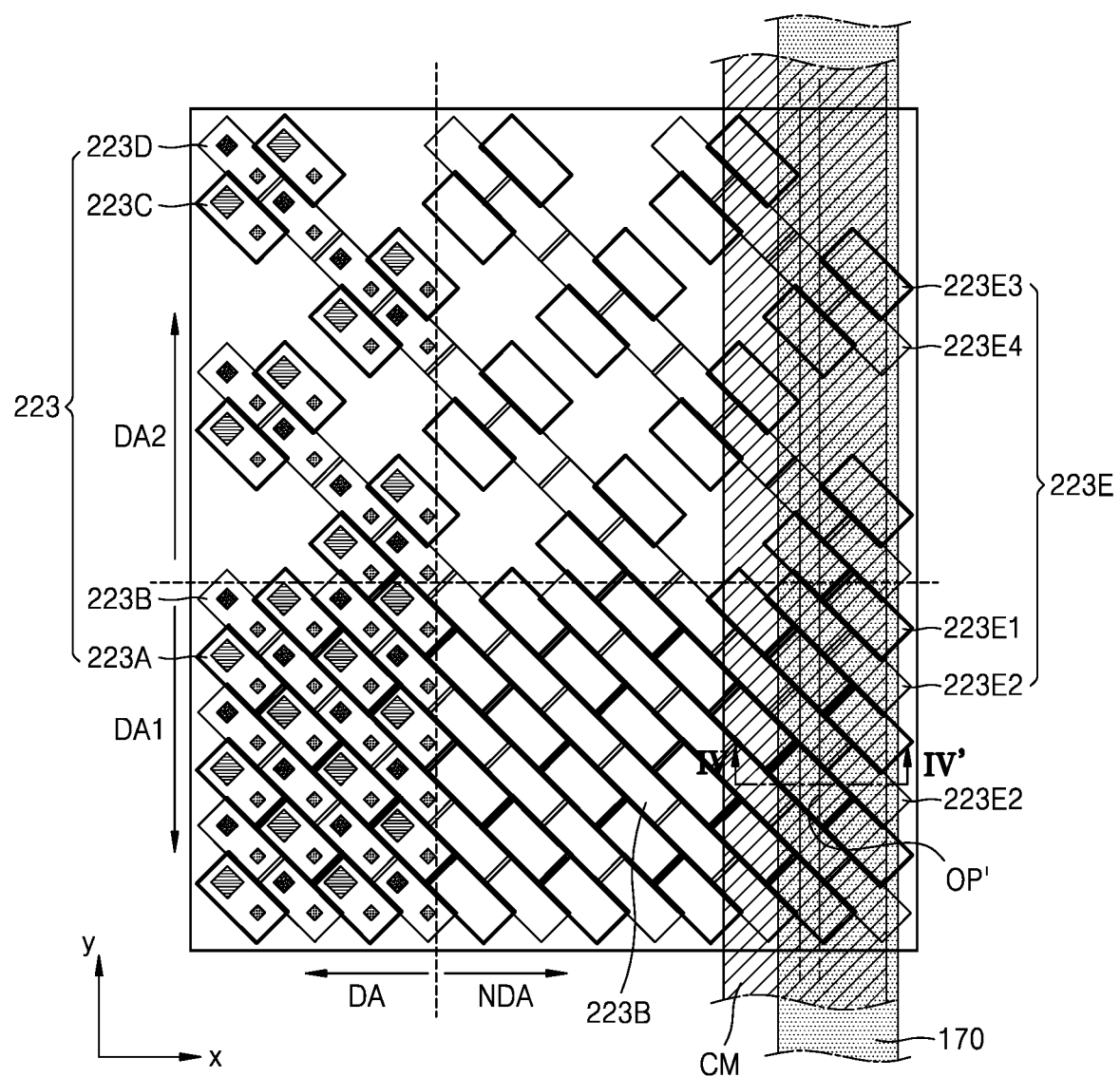
FIGS. 13A and 13B are enlarged views illustrating a region C of FIG. 12.
Figure 13B:
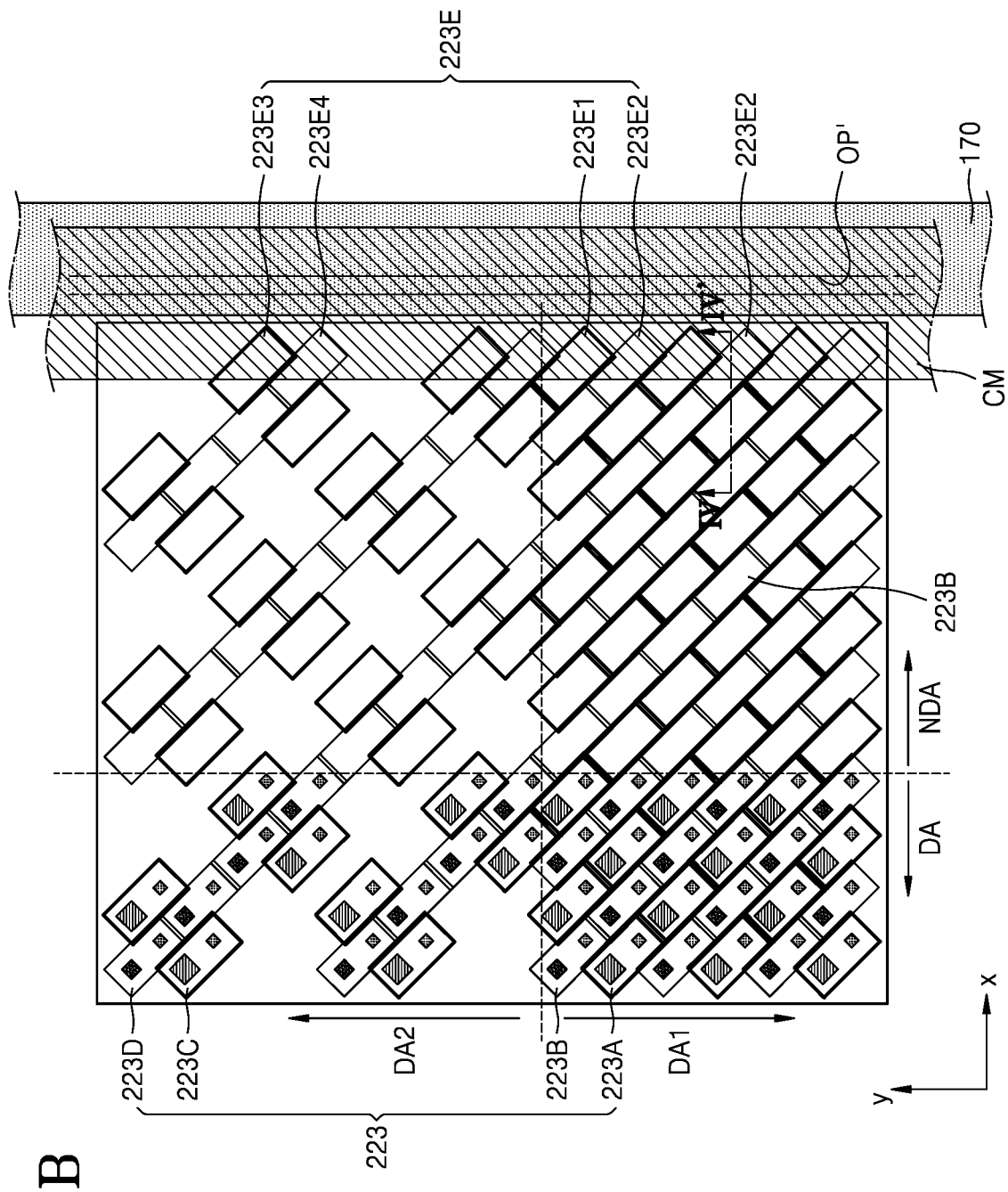
Figure 14:
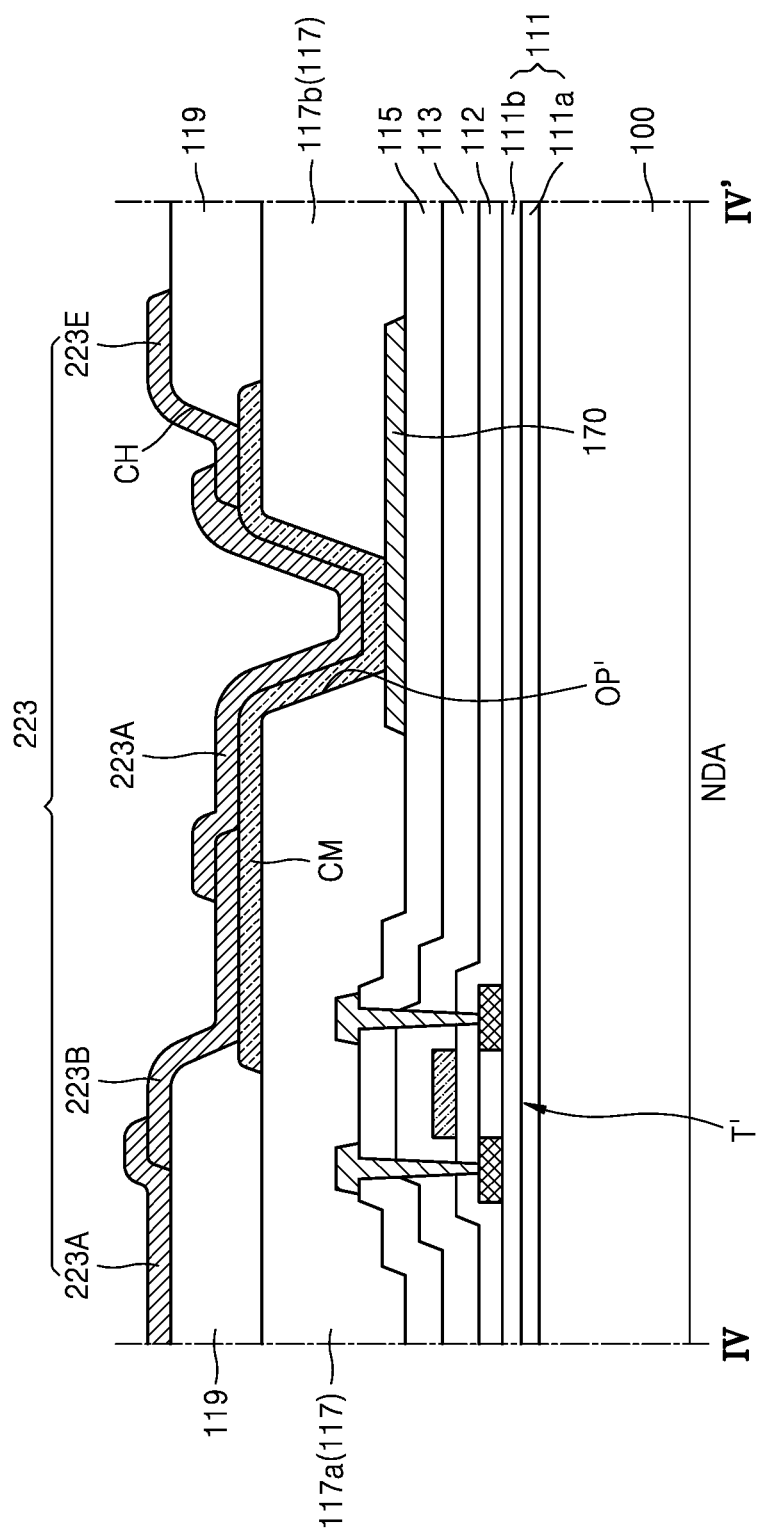
FIG. 14 is a cross-sectional view taken along line IV-IV' of FIG. 13A.

FIGS. 13A and 13B are enlarged views of a region C of FIG. 12, and FIG. 14 is a cross-sectional view taken along line IV-IV' of FIG. 13A. In FIGS. 13A to 14. To the extent that a detailed description of elements has been omitted, it may be assumed that these elements are at least similar to corresponding elements that have been described elsewhere in the instant specification.

Referring to FIG. 13A, the opposite electrode 223 may extend to the non-display area NDA. Because the opposite electrode 223 includes the first opposite electrode 223A, the second opposite electrode 223B, the third opposite electrode 223C, and the fourth opposite electrode 223D, the first opposite electrode 223A, the second opposite electrode 223B, the third opposite electrode 223C, and the fourth opposite electrode 223D may be arranged in the non-display area NDA.

The first opposite electrodes 223A and the second opposite electrodes 223B may be arranged in the non-display area NDA outside the first display area DA1. Because the first opposite electrodes 223A and the second opposite electrodes 223B may overlap and contact each other, the same voltage may be applied thereto.

The third opposite electrodes 223C and the fourth opposite electrodes 223D may be arranged in the non-display area NDA outside the second display area DA2, and a transmission area corresponding to a separation space thereof may be provided. In addition, some of the third opposite electrodes 223C and the fourth opposite electrodes 223D arranged in the non-display area NDA may be arranged in an island shape without being connected to the first opposite electrode 223A and the second opposite electrode 223B.

Outer patterns 223E1, 223E2, 223E3, and 223E4 arranged in the outermost region in the x direction may overlap and be connected to each other near the first display area DA1, and some of the outer patterns 223E1, 223E2, 223E3, and 223E4 may overlap each other and some may be spaced apart from each other near the second display area DA2. Therefore, one side of the opposite electrode 223 may have an irregular sawtooth shape. Alternatively, in a plan view, one side of the opposite electrode 223 might not have a straight line shape.

The opposite electrode 223 may be electrically connected to the second power supply line 170 to receive the second power voltage ELVSS. In an exemplary embodiment of the present disclosure, the connection line CM is arranged between the opposite electrode 223 and the second power supply line 170. The opposite electrode 223 may be electrically connected to the second power supply line 170 through the connection line CM.

Referring to FIG. 14, a thin film transistor T may be arranged between the display area DA and the second power supply line 170, the thin film transistor T' being included in the scan driving circuit 120 (see FIG. 3). Because the planarization layer 117 and the pixel-defining layer 119 are arranged on the thin film transistor T', the opposite electrode 223 may be spaced apart from the thin film transistor T.

The second power supply line 170 may include the same material as a source electrode or a drain electrode of the thin film transistor T' and be arranged on the same layer as the thin film transistor T'. The planarization layer 117 is arranged on the second power supply line 170. The planarization layer 117 may include an opening OP' exposing a portion of the second power supply line 170. As shown in FIG. 13, in a plan view, the opening OP' may include a straight line portion formed along one side of the first display area DA1 and/or the second display area DA2. In an exemplary embodiment of the present disclosure, the opening OP' may surround the first display area DA1 along the edge of the first display area DA1. Therefore, the planarization layer 117 may be divided into an inner planarization layer 117a and an outer planarization layer 117b by the opening OP'. In an exemplary embodiment of the present disclosure, the opening OP' may include a plurality of contact holes apart from each other.

The connection line CM may be arranged on the planarization layer 117, the connection line CM including the same material as the pixel electrode 221 (see FIG. 7) and being arranged on the same layer as the pixel electrode 221. The connection line CM may contact the second power supply line 170 through the opening OP'.

The pixel-defining layer 119 may be arranged on the connection line CM and may include a connection opening CH exposing a portion of the connection line CM. A portion of the opposite electrode 223 may be arranged in the connection opening CH and connected to the connection line CM.

The opposite electrode 223 may include the first opposite electrode 223A, the second opposite electrode 223B, the third opposite electrode 223C, and the fourth opposite electrode 223D. There is a region in which the first opposite electrode 223A, the second opposite electrode 223B, the third opposite electrode 223C, and the fourth opposite electrode 223D overlap one another. The thickness of the overlapping region may be greater than the thickness of non-overlapping region.

The outer pattern 223E1 arranged in the outermost portion of the opposite electrode 223 may at least partially overlap the second power supply line 170. In addition, a portion of the opposite electrode 223 may correspond to a contact hole CNT'.

Though it is shown in FIGS. 13A and 14 that the second power supply line 170 overlaps the outer pattern 223E arranged in the outermost portion of the opposite electrode 223, the present invention is not necessarily limited thereto. As shown in FIG. 13B, the outermost patterns 223E arranged in the outermost portion of the opposite electrode 223 only overlap the connection line CM and might not overlap the second power supply line 170.

Figure 15:
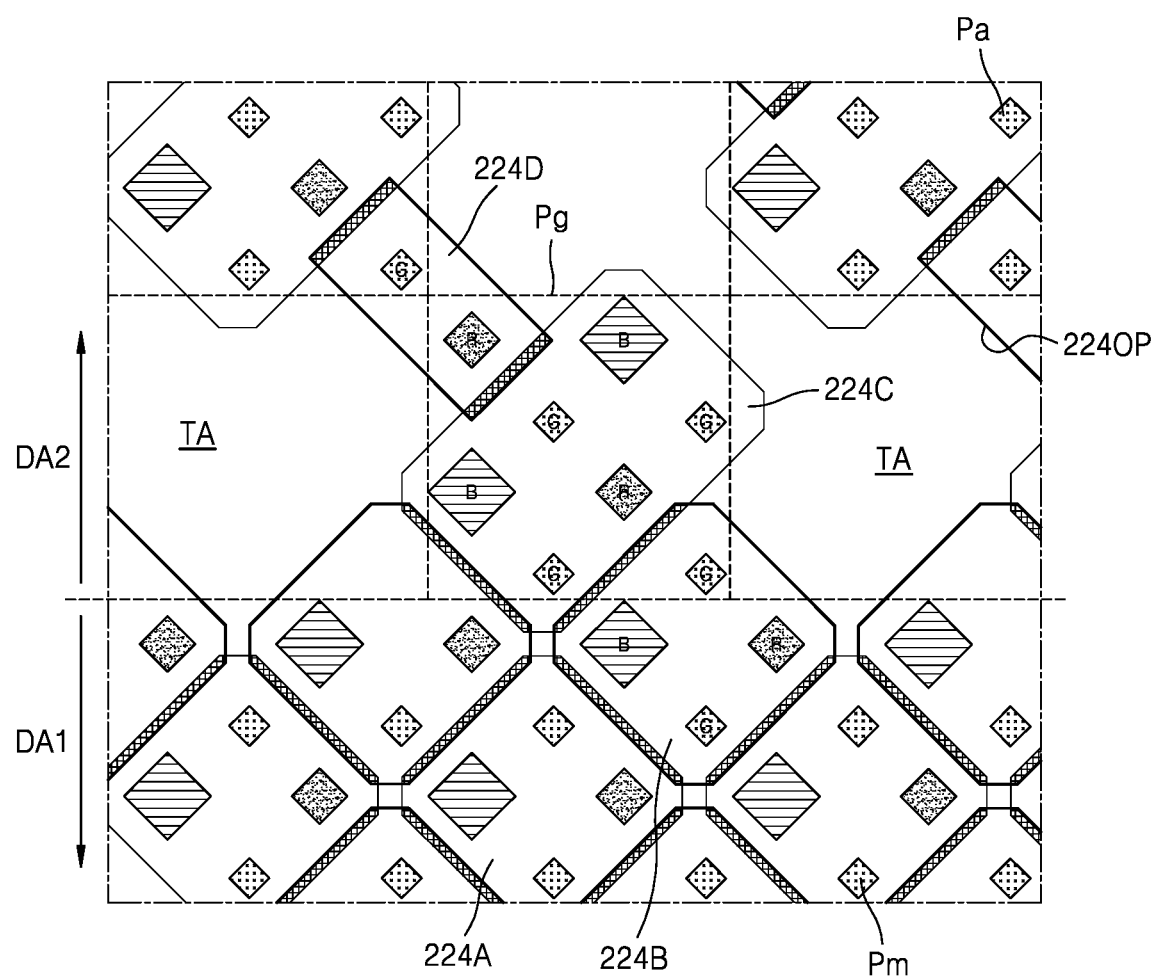
FIG. 15 is a plan view illustrating a display apparatus according to an exemplary embodiment of the present disclosure showing a portion of a boundary between a first display area and a second display area.

FIG. 15 is a plan view of the display apparatus according to an exemplary embodiment of the present disclosure showing a portion of a boundary between the first display area DA1 and the second display area DA2. To the extent that a detailed description of elements has been omitted, it may be assumed that these elements are at least similar to corresponding elements that have been described elsewhere in the instant specification.

Referring to FIG. 15, the display apparatus, according to an exemplary embodiment of the present disclosure, includes the first display area DA1, the second display area DA2, and a plurality of opposite electrodes 224, the second display area DA2 including the transmission area TA. The opposite electrode 224 may include a plurality of first opposite electrodes 224A, a plurality of second opposite electrodes 224B, a plurality of third opposite electrodes 224C, and a plurality of fourth opposite electrodes 224D, the plurality of first opposite electrodes 224A and the plurality of second opposite electrodes 224B each corresponding to the first display area DA1, and the plurality of third opposite electrodes 224C and the plurality of fourth opposite electrodes 224D each corresponding to the second display area DA2. The shape of the first opposite electrodes 224A is the same as the shape of the second opposite electrodes 224B, and the shape of the third opposite electrodes 224C is different from the shape of the fourth opposite electrodes 224D. The opposite electrodes 224 may be connected to each other, and the opposite electrode 224 may be thicker at a connection portion.

Each of the first and second opposite electrodes 224A and 224B may be arranged to correspond to the same number of pixels. For example, as shown in FIG. 15, each of the first and second opposite electrodes 224A and 224B may be arranged to correspond to four main pixels Pm. In an exemplary embodiment of the present disclosure, each of the first and second opposite electrodes 224A and 224B may be arranged to correspond to one red pixel R, one blue pixel B, and two green pixels G.

Each of the third and fourth opposite electrodes 224C and 224D may be arranged to correspond to a different number of pixels. For example, as shown in FIG. 15, the third opposite electrode 224C may be arranged to correspond to six auxiliary pixels Pa, and the fourth opposite electrode 224D may be arranged to correspond to two auxiliary pixels Pa. In an exemplary embodiment of the present disclosure, the third opposite electrode 224C may be arranged to correspond to one red pixel R, two blue pixels B, and three green pixels G. In an exemplary embodiment of the present disclosure, the fourth opposite electrode 224D may be arranged to correspond to one red pixel R and one green pixel G.

The first opposite electrode 224A and the second opposite electrode 224B may include a rhombus shape having round edges. The third opposite electrode 224C may include a rectangular shape having a long side in the b-direction. The fourth opposite electrode 224D may include a rectangular shape having a long side in the a-direction.

In the first display area DA1, the first opposite electrodes 224A and the second opposite electrodes 224B are alternately arranged with each other, and the edge of the first opposite electrode 224A overlaps the edge of the second opposite electrode 224B. In the overlapping portion, the thickness of the opposite electrode 224 may be a sum of the thickness of the first opposite electrode 224A and the thickness of the second opposite electrode 224B.

In the second display area DA2, the third opposite electrode 224C and the fourth opposite electrode 224D may be alternately arranged with each other in the a-direction. In this case, the edge of the third opposite electrode 224C may overlap the edge of the fourth opposite electrode 224D.

In the second display area DA2, the transmission areas TA are arranged. The transmission areas TA and the pixel groups Pg may be alternately arranged with each other, the pixel group Pg including the auxiliary pixels Pa. The pixel group Pg may include eight pixels. Alternatively, the auxiliary pixels Pa may at least partially surround the transmission area TA. The transmission area TA is a region in which the third and fourth opposite electrodes 224C and 224D are not arranged and may denote a region corresponding to an opening 224OP of the opposite electrode 224. In an exemplary embodiment of the present disclosure, the transmission areas TA may be connected to each other in the a-direction.

In the second display area DA2, the plurality of third opposite electrodes 224C and the plurality of fourth opposite electrodes 224D may be spaced apart from each other in the a-direction and the b-direction. For example, the third opposite electrodes 224C might not overlap each other. In addition, the fourth opposite electrodes 224D might not overlap each other.

The first to fourth opposite electrodes 223A, 223B, 223C, and 223D may be electrically connected to each other. As described above, the first and second opposite electrodes 223A and 223B may overlap and contact each other by their edges, and the third and fourth opposite electrodes 223C and 223C may overlap and contact each other by their edges. In addition, at the boundary between the first display area DA1 and the second display area DA2, the first to fourth opposite electrodes 223A, 223B, 223C, and 223D may overlap and contact each other by their edges.

The first to fourth opposite electrodes 223A, 223B, 223C, and 223D may be arranged up to the non-display area NDA and electrically connected to the second power supply line 70 (see FIG. 3) in the non-display area NDA.

Figure 16A:
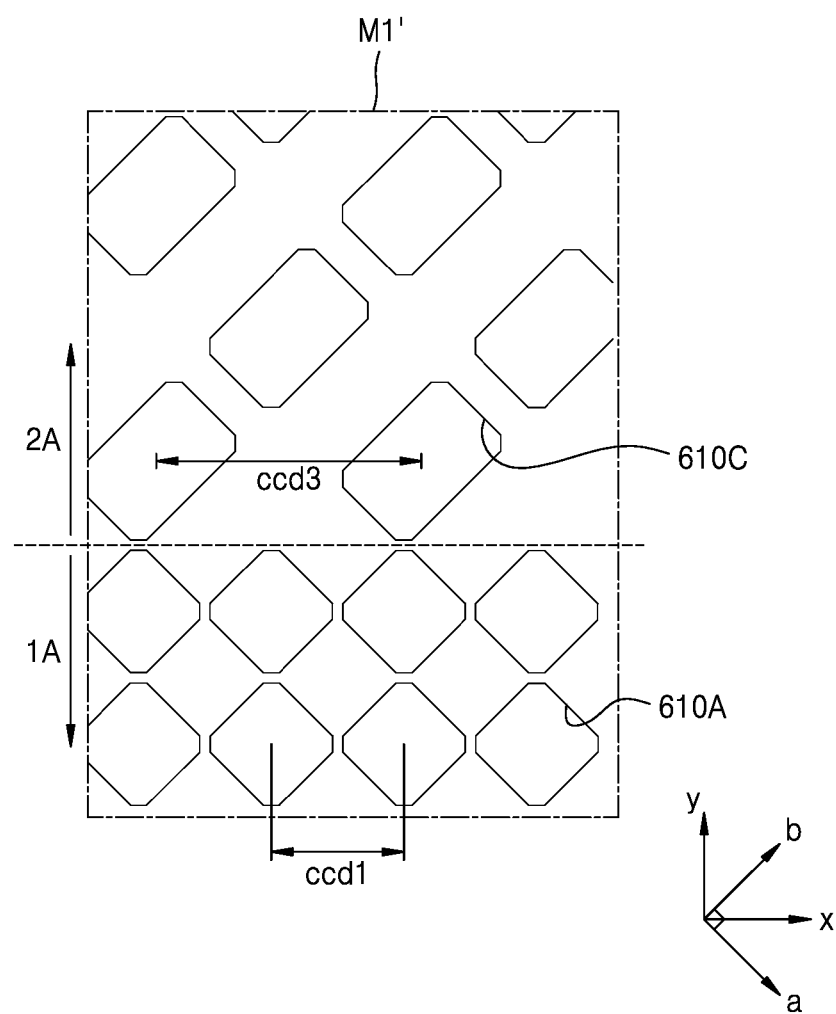
FIGS. 16A and 16B are diagrams illustrating an example of a mask for forming an opposite electrode according to an arrangement of FIG. 15.
Figure 16B:
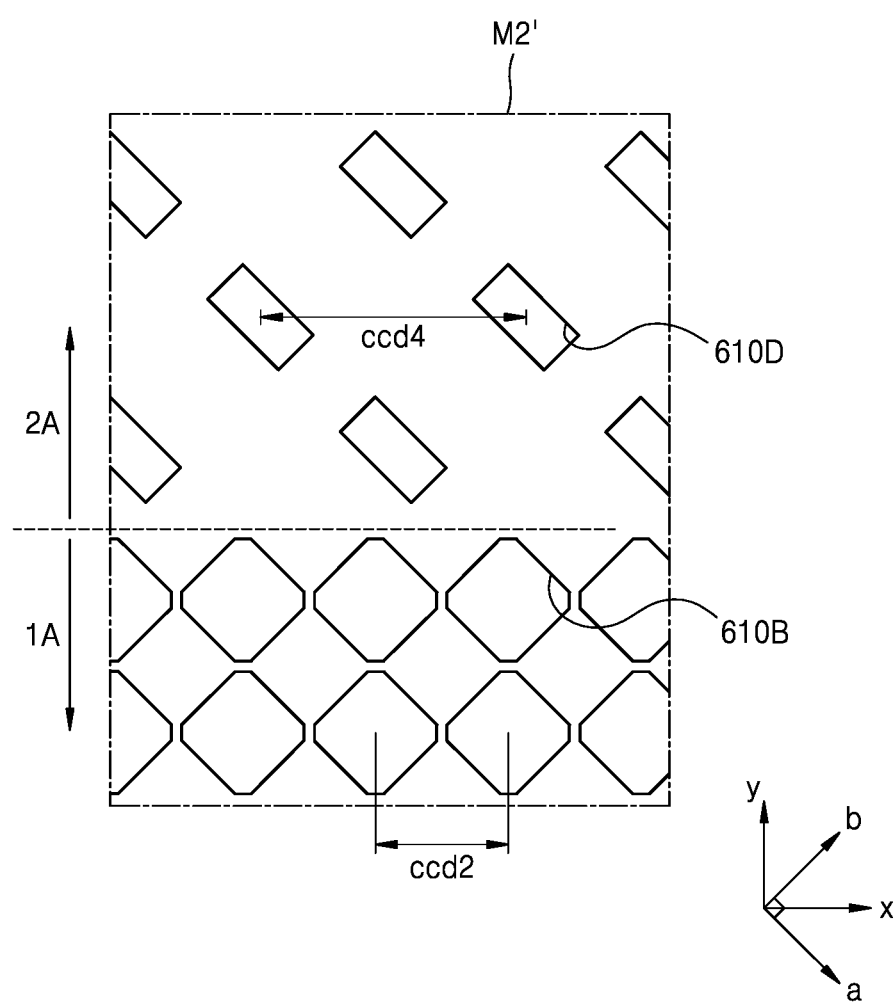
Figure 17A:
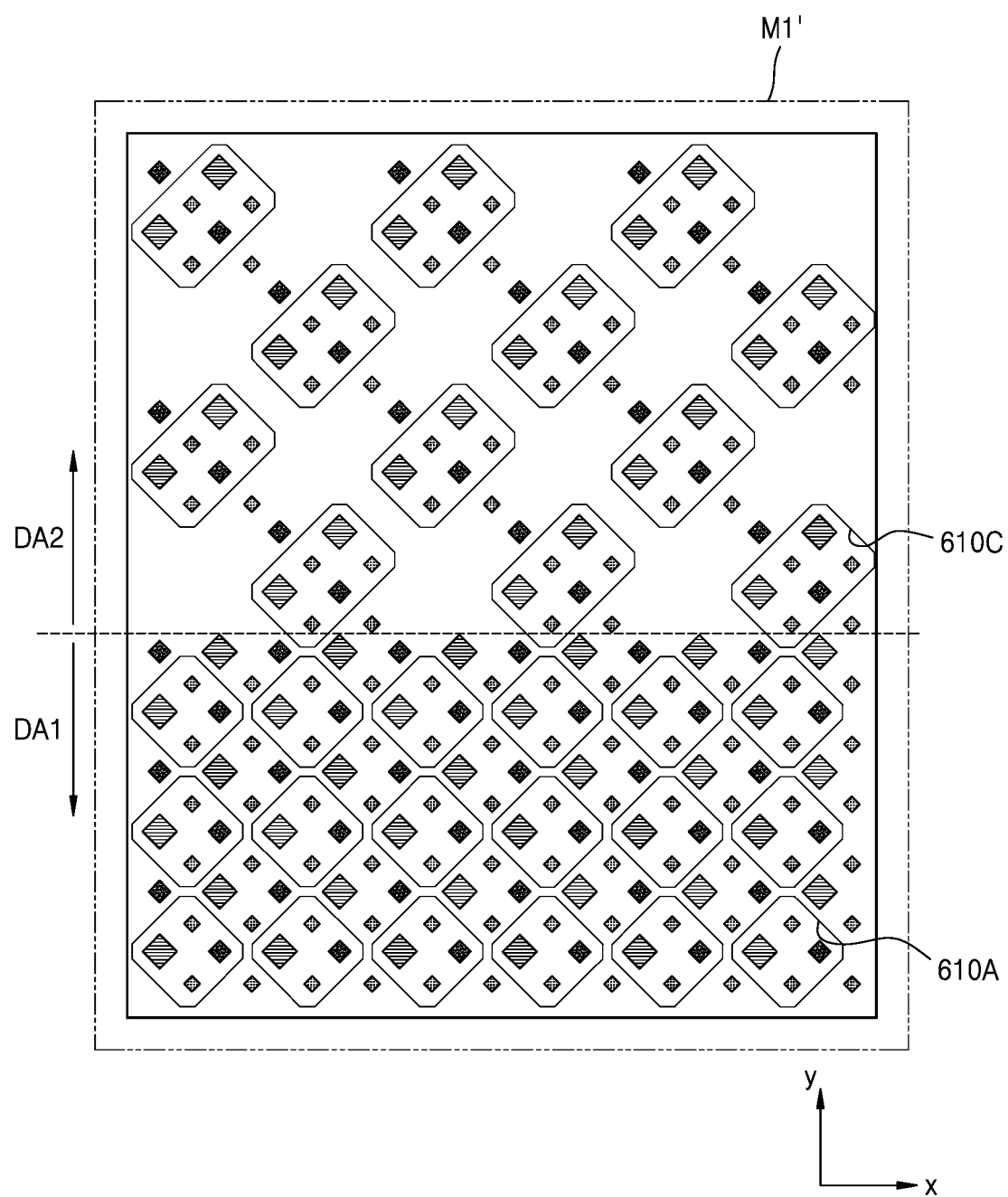
FIGS. 17A and 17B are diagrams illustrating a manufacturing method using the mask of FIGS. 16A and 16B.
Figure 17B:
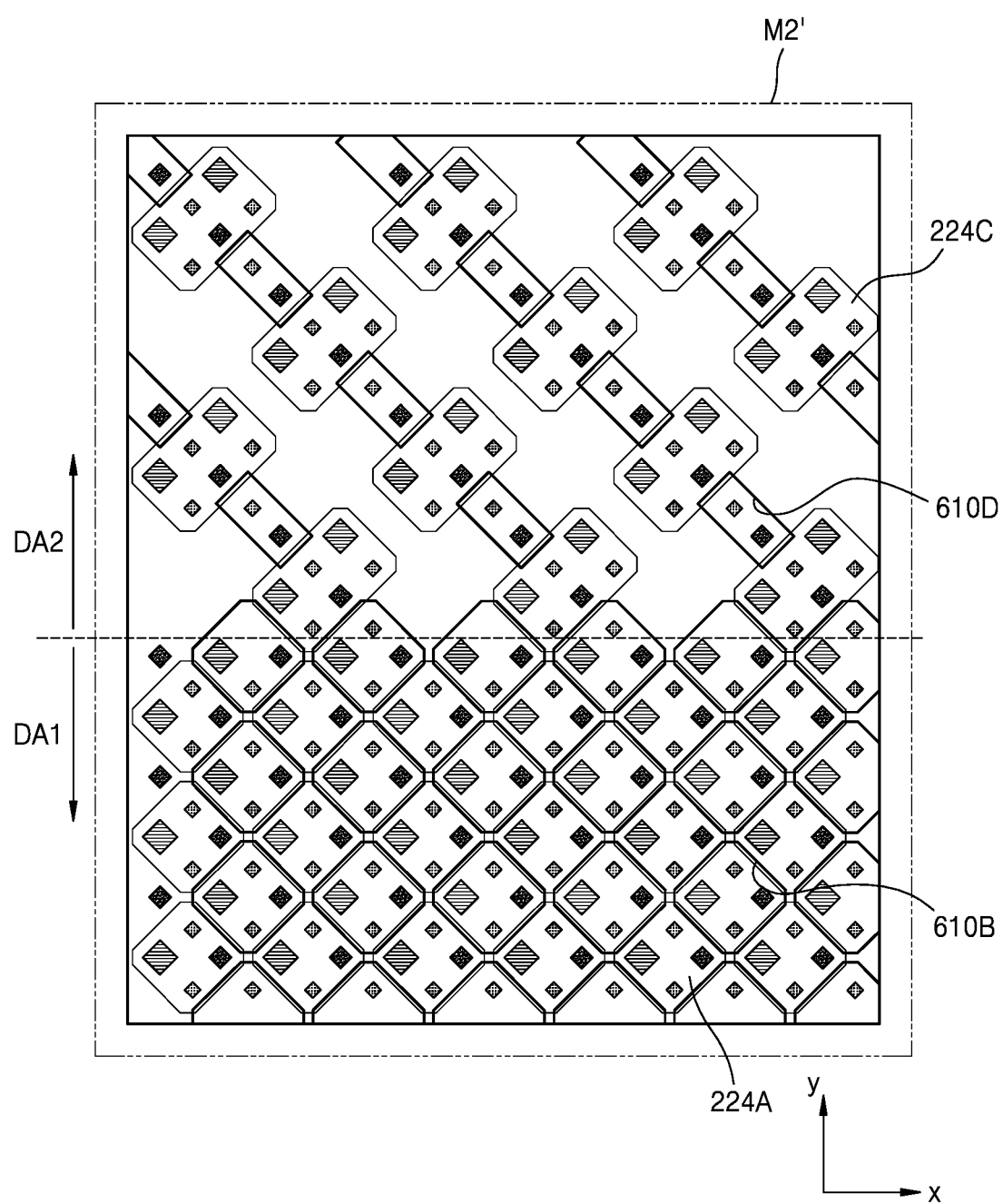

FIGS. 16A and 16B are views of an example of a mask for forming an opposite electrode according to the embodiment of FIG. 15, and FIGS. 17A and 17B are views showing a manufacturing method using the mask of FIGS. 16A and 16B.

Referring to FIG. 16A, a first mask M1', according to an exemplary embodiment of the present disclosure, includes a first mask opening 610A and a third mask opening 610C each having different shapes.

The edge of the first mask opening 610A may have around rhombus shape (e.g. a shape of a rhombus with rounded corners). The third mask opening 610C may have a long side in the b-direction and have a round rectangle-shaped edge (e.g. a shape of a rectangle with rounded corners). The area of the third mask opening 610C may be greater than the area of the first mask opening 610A.

The first mask openings 610A may be spaced apart from each other and regularly arranged (e.g. arranged at regular intervals) in the x direction and the y direction in the first area 1A of the first mask M1'. The third mask openings 610C may be spaced apart from each other and regularly arranged (e.g. arranged at regular intervals) in the x direction and the y direction in the second area 2A.

In this case, a distance ccd1 between the centers of the first mask openings 610A neighboring in the x direction may be less than a distance ccd3 between the centers of the third mask openings 610C neighboring in the x direction.

Referring to FIG. 16B, a second mask M2', according to an exemplary embodiment of the present disclosure, includes a second mask opening 610B and a fourth mask opening 610D each having different shapes.

The edge of the second mask opening 610B may have a round rhombus shape (e.g. a shape of a rhombus with rounded corners). The fourth mask opening 610D may have a rectangular shape having a long side in the a-direction. The area of the fourth mask opening 610D may be less than the area of the second mask opening 610B.

The second mask openings 610B may be spaced apart from each other and regularly arranged (e.g. arranged at regular intervals) in the x direction and the y direction in the first area 1A of the second mask M2'. The fourth mask openings 610D may be spaced apart from each other and regularly arranged (e.g. arranged at regular intervals) in the x direction and the y direction in the second area 2A.

In this case, a distance ccd2 between the centers of the second mask openings 610B neighboring in the x direction may be less than a distance ccd4 between the centers of the fourth mask openings 610D neighboring in the x direction.

The shapes and/or the sizes of the first mask opening 610A of the first mask M1' and the second mask opening 610B of the second mask M2' may be substantially the same.

The opposite electrode 224 may be formed through 2-step deposition that uses the first mask M1' and the second mask M2'. FIGS. 17A and 17B are views showing a method of depositing the opposite electrode 224 by using the first mask M1' and the second mask M2'.

Referring to FIG. 17A, after the second functional layer 222c (see FIG. 7) is formed over the substrate 100, the first mask M1' is arranged such that one first mask opening 610A of the first mask M1' corresponds to one red pixel R, one blue pixel B, and two green pixels G arranged in the first display area DA1. In addition, the first mask M1' is arranged such that one third mask opening 610C of the first mask M1' corresponds to one red pixel R, two blue pixels B, and three green pixels G arranged in the second display area DA2.

Next, a portion of the opposite electrode 224 is primarily deposited on the second functional layer 222c by emitting a deposition material to be formed as the opposite electrode from the deposition source. In this case, only a portion of the first and third opposite electrodes 224A and 224C is formed according to the arrangement of the first and third mask openings 510A and 510C of the first mask M1'.

Next, as shown in FIG. 17B, the second opposite electrode 224B and the fourth opposite electrode 224D are formed by aligning the second mask M2' over the substrate 100. For example, the second mask M2' is arranged such that the second mask opening 610B of the second mask M2' corresponds to one red pixel R, one blue pixel B, and two green pixels G arranged in the first display area DAL. In addition, the second mask M2' is arranged such that the fourth mask opening 610D of the second mask M2' corresponds to one red pixel R and one green pixel G arranged in the second display area DA2.

Next, the rest of the opposite electrode 224 is secondarily deposited on the second functional layer 222c by emitting the deposition material to be formed as the opposite electrode from the deposition source. In this case, the second and fourth opposite electrodes 224B and 224D may be formed according to the arrangement of the second and fourth mask openings 610B and 610D of the second mask M2.

The second and fourth opposite electrodes 224B and 224D respectively overlap, by their edges, the first and third opposite electrodes 224A and 224C that are already deposited, and thus electrically connected to the first and third opposite electrodes 224A and 224C.

Because the opposite electrode may be formed through a 2-step deposition process in the display apparatus, process costs and process time may be saved compared to a 4-step deposition process.

Because an opposite electrode may be formed in only a desired region by separately depositing the first to fourth opposite electrodes 224A, 224B, 224C, and 224D, a display apparatus having a high reliability may be provided. In addition, because the opposite electrode 224 is not deposited in the transmission area TA, an excellent light transmittance may be secured.

In the display apparatus according to an exemplary embodiment of the present disclosure, a pixel portion and the transmission area in which a light transmittance is increased are arranged in the second display area corresponding to a component such as a sensor, a camera, etc. Therefore, an environment under which the component may operate may be provided, and simultaneously, an image may be displayed on a region overlapping the component.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure.

What is claimed is:

1. A display apparatus, comprising:
a substrate including a first display area and a second display area;
a transmission area disposed within the second display area;
a plurality of first opposite electrodes and a plurality of second opposite electrodes each corresponding to the first display area; and
a plurality of third opposite electrodes and a plurality of fourth opposite electrodes each corresponding to the second display area,
wherein a shape of each of the plurality of first opposite electrodes is equal to a shape of each of the plurality of third opposite electrodes, and
wherein spacing between at least some of the third opposite electrodes in the second display area is larger than spacing between the first opposite electrodes in the first display area so as to permit the transmission area to be disposed between neighboring pairs of the third opposite electrodes in the second display area.

2. The display apparatus of claim 1, wherein a shape of each of the plurality of second opposite electrodes is equal to a shape of each of the plurality of fourth opposite electrodes.

3. The display apparatus of claim 1, wherein an area of each of the plurality of third opposite electrodes is different from an area of each of the plurality of fourth opposite electrodes.

4. The display apparatus of claim 1, wherein each of the plurality of first opposite electrodes and the plurality of fourth opposite electrodes corresponds to two pixels of the display apparatus.

5. The display apparatus of claim 1, wherein each of the plurality of first opposite electrodes has a first quadrangular shape having a long side extending in a first direction, and first opposite electrodes neighboring each other in the first direction among the plurality of first opposite electrodes overlap each other at an edge of the first quadrangular shape.

6. The display apparatus of claim 5, wherein the plurality of first opposite electrodes are spaced apart from each other by a separation space in a second direction intersecting with the first direction, and some of the plurality of second opposite electrodes are arranged within the separation space.

7. The display apparatus of claim 1, wherein each of the plurality of third opposite electrodes has a third quadrangular shape having a long side extending in a first direction, and the transmission area is arranged between third opposite electrodes neighboring each other in the first direction among the plurality of third opposite electrodes.

8. The display apparatus of claim 1, wherein the plurality of first opposite electrodes at least partially overlap the plurality of third opposite electrodes at a boundary between the first display area and the second display area.

9. The display apparatus of claim 1, wherein the plurality of second opposite electrodes at least partially overlap the plurality of fourth opposite electrodes at a boundary between the first display area and the second display area.

10. The display apparatus of claim 1, further comprising a region in which two first opposite electrodes among the plurality of first opposite electrodes overlap one second opposite electrode among the plurality of second opposite electrodes.

11. A display apparatus, comprising:
a substrate including a first display area, a second display area, and a non-display area, the second display area including a transmission area, and the non-display area being disposed outside of the first display area and the second display area;
opposite electrodes corresponding to both the first display area and the second display area;
a power supply line arranged in the non-display area;
a planarization layer arranged on the power supply line and including an opening exposing at least a portion of the power supply line; and
a connection line arranged on the planarization layer and connected to the power supply line through the opening,
wherein some of the opposite electrodes overlap the power supply line,
wherein some of the opposite electrodes contact the connection line,
wherein a separation space is provided between some of outer patterns of the opposite electrodes arranged in an outermost portion, and
wherein spacing between at least some of the opposite electrodes in the second display area is larger than spacing between the opposite electrodes in the first display area so as to permit the transmission area to be disposed between neighboring pairs of the opposite electrodes in the second display area.

12. The display apparatus of claim 11, wherein the opposite electrodes include a plurality of first opposite electrodes arranged in the first display area and a plurality of third opposite electrodes arranged in the second display area, and the plurality of first opposite electrodes have a same shape and a same size as the plurality of third opposite electrodes.

13. The display apparatus of claim 11, wherein the opposite electrodes include:
a plurality of first opposite electrodes and a plurality of second opposite electrodes each corresponding to the first display area; and
a plurality of third opposite electrodes and a plurality of fourth opposite electrodes each corresponding to the second display area and surrounding at least a portion of the transmission area,
wherein a shape of the plurality of first opposite electrodes is the same as that of the plurality of second opposite electrodes, and a shape of the plurality of third opposite electrodes is different from that of the plurality of fourth opposite electrodes.

14. The display apparatus of claim 11, wherein the opening includes a straight line portion formed along one side of the first display area.

15. The display apparatus of claim 11, wherein the planarization layer is divided into an inner planarization layer and an outer planarization layer by the opening.

16. The display apparatus of claim 11, wherein the separation space is not arranged between the outer patterns arranged outside the first display area.

17. A display apparatus, comprising:
a first display area including first pixels of a first pixel density;

a second display area including second pixels of a second pixel density that is less than the first pixel density; and a sensor disposed within a transmission area of the second display area, wherein spacing between at least some electrodes of the second pixels in the second display area is larger than spacing between electrodes of the first pixels in the first display area so as to permit the transmission area to be disposed within the spacing between the at least some electrodes of the second pixels in the second display area.

18. The display apparatus of claim 17, wherein a shape and size of the electrodes of the second pixels is the same as that of electrodes of the first pixel.

19. The display apparatus of claim 17, wherein the sensor is configured to emit or receive light or sound.

\* \* \* \* \*